US 6,624,648 B2
(12) United States Patent
Eldridge et al.

(10) Patent No.: US 6,624,648 B2
(45) Date of Patent: Sep. 23, 2003

(54) PROBE CARD ASSEMBLY

(75) Inventors: Benjamin N. Eldridge, Danville, CA (US); Gary W. Grube, Pleasanton, CA (US); Igor Y. Khandros, Orinda, CA (US); Gaetan L. Mathieu, Dublin, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/011,335

(22) Filed: Dec. 5, 2001

(65) Prior Publication Data

US 2002/0067181 A1 Jun. 6, 2002

Related U.S. Application Data

(63) Continuation of application No. 09/846,490, filed on Apr. 30, 2001, which is a division of application No. 09/156,957, filed on Sep. 18, 1998, now Pat. No. 6,246,247, which is a division of application No. 08/554,902, filed on Nov. 9, 1995, now Pat. No. 5,974,662, which is a continuation-in-part of application No. 08/533,584, filed on Oct. 18, 1995, now Pat. No. 5,772,451, and a continuation-in-part of application No. 08/526,246, filed on Sep. 21, 1995, now abandoned, and a continuation-in-part of application No. 08/452,255, filed on May 26, 1995, now Pat. No. 6,336,269, which is a continuation-in-part of application No. 08/340,144, filed on Nov. 15, 1994, now Pat. No. 5,917,707, and a continuation-in-part of application No. 08/152,812, filed on Nov. 16, 1993, now Pat. No. 5,476,211, said application No. 08/340,144, is a continuation-in-part of application No. 08/152,812.

(51) Int. Cl.$^7$ .............................................. G01R 31/02

(52) U.S. Cl. ...................................... 324/761; 324/754

(58) Field of Search ................................ 324/754, 755, 324/761, 762, 765; 428/209, 210; 439/482; 257/723, 724; 29/705; 361/764, 773, 776, 783, 813; 174/251, 254, 256, 260, 262, 267

(56) References Cited

U.S. PATENT DOCUMENTS

| 2,967,216 A | 1/1961 | Zablocki et al. |
| 3,654,585 A | 4/1972 | Wickersham |
| 3,663,920 A | 5/1972 | Lapham |
| 3,676,776 A | 7/1972 | Bauer et al. |
| 3,714,384 A | 1/1973 | Burkhardt |
| 3,771,110 A | 11/1973 | Reed |
| 3,826,984 A | 7/1974 | Epple |
| 3,832,632 A | 8/1974 | Ardezzone |
| 3,842,189 A | 10/1974 | Southgate |
| 3,891,924 A | 6/1975 | Ardezzone et al. |
| 3,994,552 A | 11/1976 | Selvin |
| 4,032,058 A | 6/1977 | Riseman |

(List continued on next page.)

FOREIGN PATENT DOCUMENTS

| DE | 4237591 | 5/1994 |
| EP | 295914 | 12/1988 |
| EP | 369112 | 5/1990 |

(List continued on next page.)

OTHER PUBLICATIONS

"Robust Method Using Simple Unit Processes For Thin Film Cu–Polyimide Packaging Structures," IBM Technical Disclosure Bulletin, vol. 34, No. 10A (Mar. 1992).

(List continued on next page.)

Primary Examiner—Kamand Cuneo
Assistant Examiner—Minh N. Tang
(74) Attorney, Agent, or Firm—Stuart L. Merkadeau; N. Kenneth Burraston

(57) ABSTRACT

A probe card assembly includes a probe card, a space transformer, and an interposer disposed between the space transformer and the probe card. Suitable mechanisms for adjusting the orientation of the space transformer without changing the orientation of the probe card, and for determining what adjustments to make, are disclosed.

36 Claims, 12 Drawing Sheets

U.S. PATENT DOCUMENTS

| | | | |
|---|---|---|---|
| 4,038,599 A | * 7/1977 | Bove et al. | 324/73.1 |
| 4,085,502 A | 4/1978 | Ostman et al. | |
| 4,307,928 A | 12/1981 | Petlock, Jr. | |
| 4,338,621 A | 7/1982 | Braun | |
| 4,358,175 A | 11/1982 | Reid | |
| 4,466,184 A | 8/1984 | Cuneo et al. | |
| 4,548,451 A | 10/1985 | Benarr et al. | |
| 4,553,192 A | 11/1985 | Babuka | |
| 4,567,433 A | 1/1986 | Ohkubo et al. | |
| 4,593,958 A | 6/1986 | Baba | |
| 4,615,573 A | 10/1986 | White et al. | |
| 4,616,404 A | 10/1986 | Wang et al. | |
| 4,707,655 A | 11/1987 | Kruger | |
| 4,707,657 A | 11/1987 | Boegh-Petersen | |
| 4,773,877 A | 9/1988 | Kruger et al. | |
| 4,831,614 A | 5/1989 | Duerig et al. | |
| 4,866,504 A | 9/1989 | Landis | |
| 4,893,172 A | 1/1990 | Matsumoto et al. | |
| 4,932,883 A | 6/1990 | Howard et al. | |
| 4,947,481 A | 8/1990 | Ikedo et al. | |
| 4,955,523 A | 9/1990 | Calomagno et al. | |
| 4,965,865 A | * 10/1990 | Trenary | 324/754 |
| 4,983,907 A | 1/1991 | Crowley | |
| 4,993,957 A | 2/1991 | Shino | |
| 5,017,738 A | 5/1991 | Tsuji et al. | |
| 5,067,007 A | 11/1991 | Rogers et al. | |
| 5,070,297 A | * 12/1991 | Kwon et al. | 324/754 |
| 5,071,359 A | 12/1991 | Arnio et al. | |
| 5,072,520 A | 12/1991 | Nelson | |
| 5,090,118 A | 2/1992 | Kwon et al. | |
| 5,103,557 A | 4/1992 | Leedy | |
| 5,109,596 A | * 5/1992 | Driller et al. | 29/705 |
| 5,130,779 A | 7/1992 | Agarwala et al. | |
| 5,139,427 A | 8/1992 | Boyd et al. | |
| 5,148,103 A | 9/1992 | Pasiecznik, Jr. | |
| 5,152,695 A | 10/1992 | Grabbe et al. | |
| 5,187,020 A | 2/1993 | Kwon et al. | |
| 5,189,507 A | 2/1993 | Carlomagno et al. | |
| 5,191,708 A | 3/1993 | Kasukabe et al. | |
| 5,210,939 A | 5/1993 | Mallik et al. | |
| 5,221,895 A | 6/1993 | Janko et al. | |
| 5,228,861 A | 7/1993 | Grabbe | |
| 5,237,743 A | 8/1993 | Busacco et al. | |
| 5,245,751 A | 9/1993 | Locke et al. | |
| 5,308,797 A | 5/1994 | Kee | |
| 5,317,479 A | 5/1994 | Pai et al. | |
| 5,329,226 A | 7/1994 | Monnet et al. | |
| 5,354,712 A | 10/1994 | Ho et al. | |
| 5,379,515 A | 1/1995 | Kondo et al. | |
| 5,391,521 A | 2/1995 | Kim | |
| 5,395,253 A | 3/1995 | Crumly | |
| 5,399,982 A | 3/1995 | Driller et al. | |
| 5,437,556 A | 8/1995 | Bargain et al. | |
| 5,455,390 A | 10/1995 | DiStefano et al. | |
| 5,469,733 A | 11/1995 | Yasue et al. | |
| 5,471,151 A | 11/1995 | DiFrancesco | |
| 5,475,318 A | 12/1995 | Marcus et al. | |
| 5,476,211 A | 12/1995 | Khandros | |
| 5,483,741 A | 1/1996 | Akram et al. | |
| 5,513,430 A | 5/1996 | Yanof et al. | |
| 5,521,518 A | 5/1996 | Higgins | |
| 5,534,784 A | 7/1996 | Lum et al. | |
| 5,555,422 A | 9/1996 | Nakano | |
| 5,629,631 A | 5/1997 | Perry et al. | |
| 5,632,631 A | 5/1997 | Fjelstad et al. | |
| 5,686,317 A | 11/1997 | Akram et al. | |
| 5,686,842 A | 11/1997 | Lee | |
| 5,772,451 A | 6/1998 | Dozier, II et al. | |
| 5,806,181 A | 9/1998 | Khandros et al. | |
| 5,811,982 A | 9/1998 | Beaman et al. | |
| 5,821,763 A | 10/1998 | Beaman et al. | |
| 5,828,226 A | 10/1998 | Higgins et al. | |
| 5,852,871 A | 12/1998 | Khandros | |
| 5,900,738 A | 5/1999 | Kandros et al. | |
| 5,917,707 A | 6/1999 | Khandros et al. | |
| 6,002,266 A | 12/1999 | Briggs et al. | |
| 6,029,344 A | 2/2000 | Khandros et al. | |
| 6,050,829 A | 4/2000 | Eldridge et al. | |
| 6,110,823 A | 8/2000 | Eldridge et al. | |
| 6,215,320 B1 | * 4/2001 | Parrish | 324/754 |
| 6,330,164 B1 | * 12/2001 | Khandros et al. | 257/724 |

FOREIGN PATENT DOCUMENTS

| | | |
|---|---|---|
| EP | 396248 | 11/1990 |
| EP | 402756 | 12/1990 |
| EP | 413042 | 2/1991 |
| EP | 544305 A2 | 6/1993 |
| GB | 1446196 | 8/1976 |
| JP | 588960 | 2/1983 |
| JP | 58178293 | 11/1983 |
| JP | 59-088860 | 5/1984 |
| JP | 59149070 | 10/1984 |
| JP | 6119770 | 2/1986 |
| JP | 6244285 | 3/1987 |
| JP | 62160373 | 10/1987 |
| JP | 6363777 | 4/1988 |
| JP | 63243768 | 10/1988 |
| JP | 3292406 | 11/1988 |
| JP | 1152271 | 10/1989 |
| JP | 1255240 | 10/1989 |
| JP | 4207047 | 9/1990 |
| JP | 365659 | 3/1991 |
| JP | 63279477 | 3/1991 |
| JP | 451535 | 12/1991 |
| JP | 04-93157 | 8/1992 |
| JP | 4214650 | 8/1992 |
| JP | 4240570 | 8/1992 |
| JP | 4294559 | 10/1992 |
| JP | 4357848 | 12/1992 |
| JP | 05-018741 | 1/1993 |
| JP | 529406 | 2/1993 |
| JP | 05-198716 | 8/1993 |
| JP | 5218156 | 8/1993 |
| JP | 6018555 | 1/1994 |
| JP | 650990 | 2/1994 |
| JP | 6180329 | 6/1994 |
| JP | 6249924 | 9/1994 |
| JP | 6265575 | 9/1994 |
| JP | 06-267408 | 9/1994 |
| JP | 6273445 | 9/1994 |
| JP | 6313775 | 11/1994 |
| JP | 07-021968 | 1/1995 |
| JP | 772172 | 3/1995 |
| JP | 07-333232 | 12/1995 |
| JP | 2226996 | 1/2000 |
| WO | WO 9112706 | 10/1991 |
| WO | WO92/10010 | 6/1992 |
| WO | WO 9409513 | 4/1994 |

OTHER PUBLICATIONS

Kong et al., "Integrated electrostatically resonant scan tip for an atomic force microscope," J. Vac. Sci. Technol. B 11(3) (May/Jun. 1993), pp. 634–645.

Leung et al., "Active Substrate Membrane Probe Card," Center for Integrated Systems, Stanford University, Oct. 12, 1995, pp. 29.2.1–29.2.4.

* cited by examiner

PROBE CARD ASSEMBLY

CROSS-REFERENCE TO RELATED APPLICATIONS

This patent application is a continuation of commonly-owned, copending U.S. patent application Ser. No. 09/846,490, filed Apr. 30, 2001, which is a division of commonly-owned U.S. patent application Ser. No. 09/156,957, filed Sep. 18, 1998 (now U.S. Pat. No. 6,246,247), which is a division of commonly-owned U.S. patent application Ser. No. 08/554,902, filed Nov. 9, 1995 (now U.S. Pat. No. 5,974,662), which is a continuation-in-part of commonly-owned, copending U.S. patent application Ser. No. 08/452,255 (hereinafter "PARENT CASE"), filed May 26, 1995 (now U.S. Pat. No. 6,336,269), which is a continuation-in-part of commonly-owned U.S. patent application Ser. No. 08/340,144 filed Nov. 15, 1994 (now U.S. Pat. No. 5,917,707) and its counterpart PCT patent application number PCT/US94/13373 filed Nov. 16, 1994 (published 26 May 95 as WO 95/14314), both of which are continuations-in-part of commonly-owned, copending U.S. patent application Ser. No. 08/152,812, filed Nov. 16, 1993 (now U.S. Pat. No. 5,476,211).

The aforementioned U.S. patent application Ser. No. 08/554,902, filed Nov. 9, 1995 (now U.S. Patent No. 5,974,662) is also a continuation-in-part of commonly-owned, copending U.S. patent application Ser. No. 08/526,246, filed Sep. 21, 1995 (now abandoned), and of commonly-owned, copending U.S. patent application No. 08/533,584 filed Oct. 18, 1995 now U.S. Patent No. 5,772,451).

TECHNICAL FIELD OF THE INVENTION

The invention relates to making temporary, pressure connections between electronic components and, more particularly, to techniques for performing test and burn-in procedures on semiconductor devices prior to their packaging, preferably prior to the individual semiconductor devices being singulated from a semiconductor wafer.

BACKGROUND OF THE INVENTION

Individual semiconductor (integrated circuit) devices (dies) are typically produced by creating several identical devices on a semiconductor wafer, using know techniques of photolithography, deposition, and the like. Generally, these processes are intended to create a plurality of fully-functional integrated circuit devices, prior to singulating (severing) the individual dies from the semiconductor wafer. In practice, however, certain physical defects in the wafer itself and certain defects in the processing of the wafer inevitably lead to some of the dies being "good" (fully-functional) and some of the dies being "bad" (non-functional). It is generally desirable to be able to identify which of the plurality of dies on a wafer are good dies prior to their packaging, and preferably prior to their being singulated from the wafer. To this end, a wafer "tester" or "prober" may advantageously be employed to make a plurality of discrete pressure connections to a like plurality of discrete connection pads (bond pads) on the dies. In this manner, the semiconductor dies can be tested and exercised, prior to singulating the dies from the wafer. A conventional component of a wafer tester is a "probe card" to which a plurality of probe elements are connected—tips of the probe elements effecting the pressure connections to the respective bond pads of the semiconductor dies.

Certain difficulties are inherent in any technique for probing semiconductor dies. For example, modern integrated circuits include many thousands of transistor elements requiring many hundreds of bond pads disposed in close proximity to one another (e.g., 5 mils center-to-center). Moreover, the layout of the bond pads need not be limited to single rows of bond pads disposed close to the peripheral edges of the die (See, e.g., U.S. Pat. No. 5453,583).

To effect reliable pressure connections between the probe elements and the semiconductor die one must be concerned with several parameters including, but not limited to: alignment, probe force, overdrive, contact force, balanced contact force, scrub, contact resistance, and planarization. A general discussion of these parameters may be found in U.S. Pat. No. 4,837,622, entitled HIGH DENSITY PROBE CARD, incorporated by reference herein, which discloses a high density epoxy ring probe card including a unitary printed circuit board having a central opening adapted to receive a preformed epoxy ring array of probe elements.

Generally, prior art probe card assemblies include a plurality of tungsten needles extending as cantilevers from a surface of a probe card. The tungsten needles may be mounted in any suitable manner to the probe card, such as by the intermediary of an epoxy ring, as discussed hereinabove. Generally, in any case, the needles are wired to terminals of the probe card through the intermediary of a separate and distinct wire connecting the needles to the terminals of the probe card.

Probe cards are typically formed as circular rings, with hundreds of probe elements (needles) extending from an inner periphery of the ring (and wired to terminals of the probe card). Circuit modules, and conductive traces (lines) of preferably equal length, are associated with each of the probe elements. This ring-shape layout makes it difficult, and in some cases impossible, to probe a plurality of unsingulated semiconductor dies (multiple sites) on a wafer, especially when the bond pads of each semiconductor die are arranged in other than two linear arrays along two opposite edges of the semiconductor die.

Wafer testers may alternately employ a probe membrane having a central contact bump area, as is discussed in U.S. Pat. No. 5,422.574, entitled LARGE SCALE PROTRUSION MEMBRANE FOR SEMICONDUCTOR DEVICES UNDER TEST WITH VERY HIGH PIN COUNTS, incorporated by reference herein. As noted in this patent, "A test system typically comprises a test controller for executing and controlling a series of test programs, a wafer dispensing system for mechanically handling and positioning wafers in preparation for testing and a probe card for maintaining an accurate mechanical contact with the device-under-test (DUT)." (column 1, lines 41–46).

Additional references, incorporated by reference herein, as indicative of the state of the art in testing semiconductor devices, include U.S. Pat. No. 5,442,282 (TESTING AND EXERCISING INDIVIDUAL UNSINGULATED DIES ON A WAFER); U.S. Pat. No. 5,382,898 (HIGH DENSITY PROBE CARD FOR TESTING ELECTRICAL CIRCUITS); U.S. Pat. No. 5,378,982 TEST PROBE FOR PANEL HAVING AN OVERLYING PROTECTIVE MEMBER ADJACENT PANEL CONTACTS); U.S. Pat. No. 5,339,027 (RIGID-FLEX CIRCUITS WITH RAISED FEATURES AS IC TEST PROBES); U.S. Pat. No. 5,180,977 (MEMBRANE PROBE CONTACT BUMP COMPLIANCY SYSTEM); U.S. Pat. No. 5,066,907 (PROBE SYSTEM FOR DEVICE AN CIRCUIT TESTING); U.S. Pat. No. 4,757,256 (HIGH DENSITY PROBE CARD); U.S. Pat. No. 4,161,692 (PROBE DEVICE FOR INTEGRATED CIRCUIT WAFERS); and U.S. Pat. No. 3,990,689

(ADJUSTABLE HOLDER ASSEMBLY FOR POSITIONING A VACUUM CHUCK).

Generally, interconnections between electronic components can be classified into the two broad categories of "relatively permanent" and "readily demountable".

An example of a "relatively permanent" connection is a solder joint. Once two components are soldered to one another, a process of unsoldering must be used to separate the components. A wire bond is another example of a "relatively permanent" connection.

An example of a "readily demountable" connection is rigid pins of one electronic component being received by resilient socket elements of another electronic component. The socket elements exert a contact force (pressure) on the pins in an amount sufficient to ensure a reliable electrical connection therebetween.

Interconnection elements intended to make pressure contact with terminals of an electronic component are referred to herein as "springs" or "spring elements". Generally, a certain minimum contact force is desired to effect reliable pressure contact to electronic components (e.g., to terminals on electronic components). For example, a contact (load) force of approximately 15 grams (including as little as 2 grams or less and as much as 150 grams or more, per contact) may be desired to ensure that a reliable electrical connection is made to a terminal of an electronic component which may be contaminated with films on its surface, or which has corrosion or oxidation products on its surface. The minimum contact force required of each spring demands either that the yield strength of the spring material or that the size of the spring element are increased. As a general proposition, the higher the yield strength of a material, the more difficult it will be to work with (e.g., punch, bend, etc.). And the desire to make springs smaller essentially rules out making them larger in cross-section.

Probe elements are a class of spring elements of particular relevance to the present invention. Prior art probe elements are commonly fabricated from tungsten, a relatively hard (high yield strength) material. When it is desired to mount such relatively hard materials to terminals of an electronic component, relatively "hostile" (e.g., high temperature) processes such as brazing are required. Such "hostile" processes are generally not desirable (and often not feasible) in the context of certain relatively "fragile" electronic components such as semiconductor devices. In contrast thereto, wire bonding is an example of a relatively "friendly" processes which is much less potentially damaging to fragile electronic components than brazing. Soldering is another example of a relatively "friendly" process. However, both solder and gold are relatively soft (low yield strength) materials which will not function well as spring elements.

A subtle problem associated with interconnection elements, including spring contacts, is that, often, the terminals of an electronic component are not perfectly coplanar. Interconnection elements lacking in some mechanism incorporated therewith for accommodating these "tolerances" (gross non-planarities) will be hard pressed to make consistent contact pressure contact with the terminals of the electronic component.

The following U.S. Patents, incorporated by reference herein, are cited as being of general interest vis-a-vis making connections, particularly pressure connections, to electronic components: U.S. Pat. No. 5,386,344 (FLEX CIRCUIT CARD ELASTOMERIC CABLE CONNECTOR ASSEMBLY); U.S. Pat. No. 5,336,380 (SPRING BIASED TAPERED CONTACT ELEMENTS FOR ELECTRICAL CONNECTORS AND INTEGRATED CIRCUIT PACKAGES); U.S. Pat. No. 5,317,479 (PLATED COMPLIANT LEAD); U.S. Pat. No. 5,086,337 (CONNECTING STRUCTURE OF ELECTRONIC PART AND ELECTRONIC DEVICE USING THE STRUCTURE); U.S. Pat. No. 5,067,007 (SEMICONDUCTOR DEVICE HAVING LEADS FOR MOUNTING TO A SURFACE OF A PRINTED CIRCUIT BOARD); U.S. Pat. No. 4,989,069 (SEMICONDUCTOR PACKAGE HAVING LEADS THAT BREAK-AWAY FROM SUPPORTS); U.S. Pat. No. 4,893,172 (CONNECTING STRUCTURE FOR ELECTRONIC PART AND METHOD OF MANUFACTURING THE SAME); U.S. Pat. No. 4,793,814 (ELECTRICAL CIRCUIT BOARD INTERCONNECT); U.S. Pat. No. 4,777,564 (LEADFORM FOR USE WITH SURFACE MOUNTED COMPONENTS); U.S. Pat. No. 4,764,848 (SURFACE MOUNTED ARRAY STRAIN RELIEF DEVICE); U.S. Pat. No. 4,667,210 (SEMICONDUCTOR CHIP INTERFACE); U.S. Pat. No. 4,642,889 (COMPLIANT INTERCONNECTION AND METHOD THEREFOR); U.S. Pat. No. 4.330,16 (PRESS-CONTACT TYPE INTERCONNECTORS); U.S. Pat. No. 4,295,700 (INTERCONNECTORS); U.S. Pat. No. 4,067,104 (METHOD OF FABRICATING AN ARRAY OF FLEXIBLE METALLIC INTERCONNECTS FOR COUPLING MICROELECTRONICS COMPONENTS); U.S. Pat. No. 3,795,037 (ELECTRICAL CONNECTOR DEVICES); U.S. Pat. No. 3,616,532 (MULTILAYER PRINTED CIRCUIT ELECTRICAL INTERCONNECTION DEVICE); and U.S. Pat. No. 3,509,270 (INTERCONNECTION FOR PRINTED CIRCUITS AND METHOD OF MAKING SAME).

BRIEF DESCRIPTION (SUMMARY) OF THE INVENTION

It is an object of the present invention to provide a technique for probing semiconductor devices, particularly while they are resident on a semiconductor wafer.

It is another object of the present invention to provide a technique for probing semiconductor devices that allows the tips of the probe elements to be oriented without changing the position of the probe card.

It is another object of the present invention to provide an improved spring element (resilient contact structure) that can be mounted directly to a terminal of an electronic component.

It is another object of the invention to provide interconnection elements that are suitable for making pressure contact to electronic components.

According to the invention, a probe card assembly includes a probe card (electronic component) having a top surface, a bottom surface and a plurality of terminals on the top surface thereof; an interposer (electronic component) having a top surface, a bottom surface, a first plurality of resilient contact structures extending from terminals on the bottom surface thereof and a second plurality of contact structures extending from terminals on the top surface thereof; and a space transformer (electronic component) having a top surface, a bottom surface, a plurality of contact pads (terminals) disposed on the bottom surface thereof, and a third plurality of resilient contact structures (probe elements) extending from terminals on the top surface thereof.

The interposer is disposed between the top surface of the probe card and the bottom surface of the space transformer, and allows the orientation (planarity) of the space transformer to be adjusted without altering the orientation of the probe card. A suitable mechanism for effecting this adjustment of space transformer orientation, and a technique for determining the correct orientation of the space transformer are disclosed herein. In this manner, the tips (distal ends) of the probe elements can be adjusted to ensure reliable pressure contact between the tips of the probe elements and corresponding bond pads (terminals) of a semiconductor device being probed.

Alternatively, a plurality of resilient contact structures are provided on the bottom surface of the space transformer component (i.e., fabricated on the terminals on the bottom surface of the space transformer), in lieu of the interposer component, for making contact directly (i.e., without the intermediary of the interposer) to the terminals on the top surface of the probe card.

Generally, the space transformer component permits a plurality of resilient contact structures extending from its top surface to make contact with terminals of an electronic component (i.e., bond pads on semiconductor devices) at a relatively fine pitch (spacing), while connections to the space transformer (i.e., to the bond pads or, alternatively, resilient contact structures) on its bottom surface are effected at a relatively coarser pitch.

According to an aspect of the invention, the space transformer and interposer components of the probe card assembly may be provided as a "kit", adapted for use with a probe card. Optionally, the mechanism for adjusting the orientation of the space transformer can be included in the "kit".

According to an aspect of the invention, the resilient contact structures (probe elements) extending from the top surface of the space transformer component are "composite interconnection elements" (defined hereinbelow). In the alternate case of resilient contact structures also extending from the bottom surface of the space transformer, these may be "composite interconnection elements" as well.

According to an aspect of the invention, the resilient contact structures extending from the top and bottom surfaces of the interposer component are "composite interconnection elements" (defined hereinbelow).

According to an aspect of the invention, the probe elements (resilient contact structures extending from the top surface of the space transformer component) are preferably formed as "composite interconnection elements" which are fabricated directly upon the terminals of the space transformer component of the probe card assembly. The "composite " (multilayer) interconnection element is fabricated by mounting an elongate element ("core") to an electronic component, shaping the core to have a spring shape, and overcoating the core to enhance the physical (e.g., spring) characteristics of the resulting composite interconnection element and/or to securely anchor the resulting composite interconnection element to the electronic component. The resilient contact structures of the interposer component may also be formed as composite interconnection elements.

The use of the term "composite", throughout the description set forth herein, is consistent with a 'generic' meaning of the term (e.g., formed of two or more elements), and is not to be confused with any usage of the term "composite" in other fields of endeavor, for example, as it may be applied to materials such as glass, carbon or other fibers supported in a matrix or resin or the like.

As used herein, the term "spring shape" refers to virtually any share of an elongate element which will exhibit elastic (restorative) movement of an end (tip) of the elongate element with respect to a force applied to the tip. This includes elongate elements, shaped to have one or more bends, as well as substantially straight elongate elements.

As used herein, the terms "contact area", "terminal", "pad", and the like refer to any conductive area on any electronic component to which an interconnection element is mounted or makes contact.

Alternatively, the core is shaped prior to mounting to an electronic component.

Alternatively, the core is mounted to or is a part of a sacrificial substrate which is not an electronic component. The sacrificial substrate is removed after shaping, and either before or after overcoating. According to an aspect of the invention, tips having various topographies can be disposed at the contact ends of the interconnection elements. (See also FIGS. 11A–11F of the PARENT CASE.)

In an embodiment of the invention, the core is a "soft" material having a relatively low yield strength, and is overcoated with a "hard" material having a relatively high yield strength. For example, a soft material such as a gold wire is attached (e.g., by wire bonding) to a bond pad of a semiconductor device and is overcoated (e.g., by electrochemical plating) with a hard material such nickel and its alloys.

Vis-a-vis overcoating the core, single and multi-layer overcoatings, "rough" overcoatings having microprotrusions (see also FIGS. 5C and 5D of the PARENT CASE), and overcoatings extending the entire length of or only a portion of the length of the core, are described. In the latter case, the tip of the core may suitably be exposed for making contact to an electronic component (see also FIG. 5B of the PARENT CASE).

Generally, throughout the description set forth herein, the term "plating" is used as exemplary of a number of techniques for overcoating the core. It is within the scope of this invention that the core can be overcoated by any suitable technique including, but not limited to: various processes involving deposition of materials out of aqueous solutions; electrolytic plating; electroless plating; chemical vapor deposition (CVD); physical vapor deposition (PVD); processes causing the deposition of materials through induced disintegration of liquid or solid precursors; and the like, all of these techniques for depositing materials being generally well known.

Generally, for overcoating the core with a metallic material such as nickel, electrochemical processes are preferred, especially electroless plating.

In another embodiment of the invention, the core is an elongate element of a "hard" material, inherently suitable to functioning as a spring element, and is mounted at one end to a terminal of an electronic component. The core, and at least an adjacent area of the terminal, is overcoated with a material which will enhance anchoring the core to the terminal. In this manner, it is not necessary that the core be well-mounted to the terminal prior to overcoating, and processes which are less potentially damaging to the electronic component may be employed to "tack" the core in place for subsequent overcoating. These "friendly" processes include soldering, gluing, and piercing an end of the hard core into a soft portion of the terminal.

Preferably, the core is in the form of a wire. Alternatively, the core is a flat tab (conductive metallic ribbon).

Representative materials, both for the core and for the overcoatings, are disclosed.

In the main hereinafter, techniques involving beginning with a relatively soft (low yield strength) core, which is generally of very small dimension (e.g., 3.0 mil or less) are described. Soft materials, such as gold, which attach easily to semiconductor devices, generally lack sufficient resiliency to function as springs. (Such soft, metallic materials exhibit primarily plastic, rather than elastic deformation.) Other soft materials which may attach easily to semiconductor devices and possess appropriate resiliency are often electrically non-conductive, as in the case of most elastomeric materials. In either case, desired structural and electrical characteristics can be imparted to the resulting composite interconnection element by the overcoating applied over the core. The resulting composite interconnection element can be made very small, yet can exhibit appropriate contact forces. Moreover, a plurality of such composite interconnection elements can be arranged at a fine pitch (e.g., 10 mils), even though they have a length (e.g., 100 mils) which is much greater than the distance to a neighboring composite interconnection element (the distance between neighboring interconnection elements being termed "pitch").

It is within the scope of this invention that composite interconnection elements can be fabricated on a microminiature scale, for example as "microsprings" for connectors and sockets, having cross-sectional dimensions on the order of twenty-five microns ($\mu$m), or less. This ability to manufacture reliable interconnection having dimensions measured in microns, rather than mils, squarely addresses the evolving needs of existing interconnection technology and future area array technology.

The composite interconnection elements of the present invention exhibit superior electrical characteristics, including electrical conductivity, solderability and low contact resistance. In many cases, deflection of the interconnection element in response to applied contact forces results in a "wiping" contact, which helps ensure that a reliable contact is made.

An additional advantage of the present invention is that connections made with the interconnection elements of the present invention are readily demountable. Soldering, to effect the interconnection to a terminal of an electronic component is optional, but is generally not preferred at a system level.

According to an aspect of the invention, techniques are described for making interconnection elements having controlled impedance. These techniques generally involve coating (e.g., electrophoretically) a conductive core or an entire composite interconnection element with a dielectric material (insulating layer), and overcoating the dielectric material with an outer layer of a conductive material. By grounding the outer conductive material layer, the resulting interconnection element can effectively be shielded, and its impedance can readily be controlled. (See also FIG. 10K of the PARENT CASE.)

According to an aspect of the invention, interconnection elements can be pre-fabricated as individual units, for later attachment to electronic components. Various techniques for accomplishing this objective are set forth herein. Although not specifically covered in this document, it is deemed to be relatively straightforward to fabricate a machine that will handle the mounting of a plurality of individual interconnection elements to a substrate or, alternatively, suspending a plurality of individual interconnection elements in an elastomer, or on a support substrate.

It should clearly be understood that the composite interconnection element of the present invention differs dramatically from interconnection elements of the prior art which have been coated to enhance their electrical conductivity characteristics or to enhance their resistance to corrosion.

The overcoating of the present invention is specifically intended to substantially enhance anchoring of the interconnection element to a terminal of an electronic component and/or to impart desired resilient characteristics to the resulting composite interconnection element. Stresses (contact forces) are directed to portions of the interconnection elements which are specifically intended to absorb the stresses.

It should also be appreciated that the present invention provides essentially a new technique for making spring structures. Generally, the operative structure of the resulting spring is a product of plating, rather than of bending and shaping. This opens the door to using a wide variety of materials to establish the spring shape, and a variety of "friendly" processes for attaching the "falsework" of the core to electronic components. The overcoating functions as a "superstructure" over the "falsework" of the core, both of which terms have their origins in the field of civil engineering.

A distinct advantage of the present invention is that probe elements (resilient contact structures) can be fabricated directly on terminals of a space transformer substrate component of a probe card assembly without requiring additional materials, such as brazing or soldering.

According co an aspect of the invention, any of the resilient contact structures may be formed as at least two composite interconnection elements.

Other objects, features and advantages of the invention will become apparent in light of the following description thereof.

BRIEF DESCRIPTION OF THE DRAWINGS

Reference will be made in detail to preferred embodiments of the invention, examples of which are illustrated in the accompanying drawings. Although the invention will be described in the context of these preferred embodiments, it should be understood that it is not intended to limit the spirit and scope of the invention to these particular embodiments.

DETAILED DESCRIPTION OF THE INVENTION

This patent application is directed to probe card assemblies, components thereof, and methods of using same. As will be evident from the description that follows, the use of resilient contact structures to effect pressure connections to terminals of an electronic component is essential. Preferably, the resilient contact structures are implemented as "composite interconnection elements", such as have been described in the disclosure of the aforementioned U.S. patent application Ser. No. 08/452,255, filed May 26, 1995 ("PARENT CASE"), incorporated by reference herein. This patent application summarizes several of the techniques disclosed in the PARENT CASE in the discussions of FIGS. 1A–1E and 2A–2I.

An important aspect of the preferred technique for practicing the present invention is that a "composite" interconnection element can be formed by starting with a core (which may be mounted to a terminal of an electronic component), then overcoating the core with an appropriate material to: (1) establish the mechanical properties of the resulting composite interconnection element; and/or (2) when the interconnection element is mounted to a terminal of an electronic component, securely anchor the interconnection element to the terminal. In this manner, a resilient interconnection element (spring element) can be fabricated, starting with a core of a soft material which is readily shaped into a springable shape and which is readily attached to even the most fragile of electronic components. In light of prior art techniques of forming spring elements from hard materials, is not readily apparent, and is arguably counter-intuitive, that soft materials can form the basis of spring elements. Such a "composite" interconnection element is generally the preferred form of resilient contact structure for use in the embodiments of the present invention.

FIGS. 1A, 1B, 1C and 1D illustrate, in a general manner, various shapes for composite interconnection elements, according to the present invention.

In the main, hereinafter, composite interconnection elements which exhibit resiliency are described. However, it should be understood that non-resilient composite interconnection elements fall within the scope of the invention.

Further, in the main hereinafter, composite interconnection elements that have a soft (readily shaped, and amenable to affixing by friendly processes to electronic components) core, overcoated by hard (springy) materials are described. It is, however, within the scope of the invention that the core can be a hard material—the overcoat serving primarily to securely anchor the interconnection element to a terminal of an electronic component.

Figure 1A:
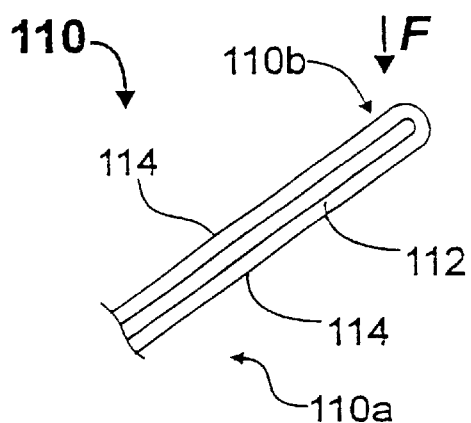
FIG. 1A is a cross-sectional view of a longitudinal portion, including one end, of an interconnection element, according to an embodiment of the invention.

In FIG. 1A, an electrical interconnection element 110 includes a core 112 of a "soft" material (e.g., a material having a yield strength of less than 40,000 psi), and a shell (overcoat) 114 of a "hard" material (e.g., a material having a yield strength of greater than 80,000 psi). The core 112 is an elongate element shaped (configured) as a substantially straight cantilever beam, and may be a wire having a diameter of 0.0005–0.0030 inches (0.001 inch=1 mil≈25 microns ($\mu$m)). The shell 114 is applied over the already-shaped core 112 by any suitable process, such as by a suitable plating process (e.g., by electrochemical plating).

FIG. 1A illustrates what is perhaps the simplest of spring shapes for an interconnection element of the present invention—namely, a straight cantilever beam oriented at an angle to a force "F" applied at its tip 110b. When such a force is applied by a terminal of an electronic component to which the interconnection element is making a pressure contact, the downward (as viewed) deflection of the tip will evidently result in the tip moving across the terminal, in a "wiping" motion. Such a wiping contact ensures a reliable contact being made between the interconnection element and the contacted terminal of the electronic component.

By virtue of its "hardness", and by controlling its thickness (0.00025–0.00500 inches), the shell 114 imparts a desired resiliency to the overall interconnection element 110. In this manner, a resilient interconnection between electronic components (not shown) can be effected between the two ends 110a and 110b of the interconnection element 110. (In FIG. 1A, the reference numeral 110a indicates an end portion of the interconnection element 110, and the actual end opposite the end 110b is not shown.) In contacting a terminal of an electronic component, the interconnection element 110 would be subjected to a contact force (pressure), as indicated by the arrow labelled "F".

The interconnection element (e.g., 110) will deflect in response to an applied contact force, said deflection (resiliency) being determined in part by the overall shape of the interconnection element, in part by the dominant (greater) yield strength of the overcoating material (versus that of the core), and in part by the thickness of the overcoating material.

As used herein, the terms "cantilever" and "cantilever beam" are used to indicate that an elongate structure (e.g., the overcoated core 112) is mounted (fixed) at one end, and the other end is free to move, typically in response to a force acting generally transverse to the longitudinal axis of the elongate element. No other specific or limiting meaning is intended to be conveyed or connoted by the use of these terms.

Figure 1B:
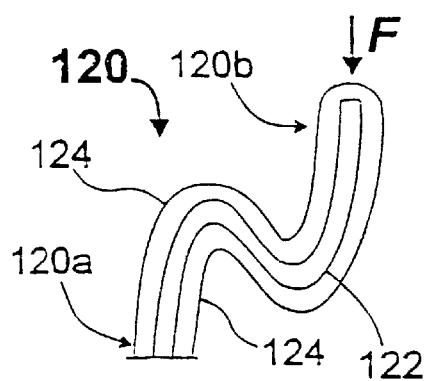
FIG. 1B is a cross-sectional view of a longitudinal portion, including one end, of an interconnection element, according to another embodiment of the invention.

In FIG. 1B, an electrical interconnection element 120 similarly includes a soft core 122 (compare 112) and a hard shell 124 (compare 114). In this example, the core 122 is shaped to have two bends, and thus may be considered to be S-shaped. As in the example of FIG. 1A, in this manner, a resilient interconnection between electronic components (not shown) can be effected between the two ends 120a and 120b of the interconnection element 120. (In FIG. 1B, reference numeral 120a indicates an end portion of the interconnection element 120, and the actual end opposite the end 120b is not shown.) In contacting a terminal of an electronic component, the interconnection element 120 would be subjected to a contact force (pressure), as indicated by the arrow labelled "F".

Figure 1C:
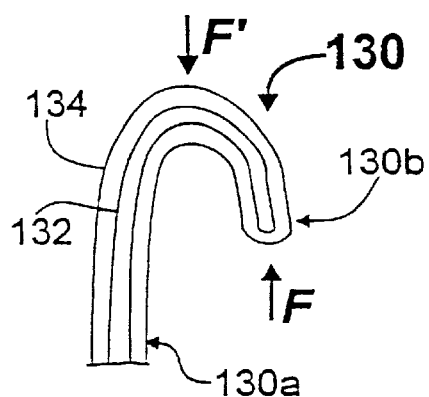
FIG. 1C is a cross-sectional view of a longitudinal portion, including one end of an interconnection element, according to another embodiment of the invention.

In FIG. 1C, an electrical interconnection element 130 similarly includes a soft core 132 (compare 112) and a hard shell 134 (compare 114). In this example, the core 132 is shaped to have one bend, and may be considered to be U-shaped. As in the example of FIG. 1A, in this manner, a resilient interconnection between electronic components (not shown) can be effected between the two ends 130a and 130b of the interconnection element 130. (In FIG. 1C, the reference numeral 130a indicates an end portion of the interconnection element 130, and the actual end opposite the end 130b is not shown.) In contacting a terminal of an electronic component, the interconnection element 130 could be subjected to a contact force (pressure), as indicated by the arrow labelled "F". Alternatively, the interconnection element 130 could be employed to make contact at other than its end 130b, as indicated by the arrow labelled "F'".

Figure 1D:
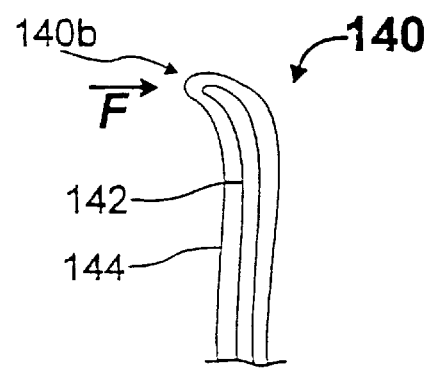
FIG. 1D is a cross-sectional view of a longitudinal portion, including one end of an interconnection element, according to another embodiment of the invention.

FIG. 1D illustrates another embodiment of a resilient interconnection element 140 having a soft core 142 and a hard shell 144. In this example, the interconnection element 140 is essentially a simple cantilever (compare FIG. 1A), with a curved tip 140b, subject to a contact force "F" acting transverse to its longitudinal axis.

Figure 1E:
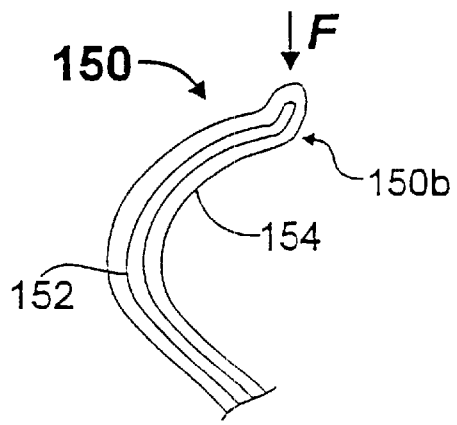
FIG. 1E is a cross-sectional view of a longitudinal portion, including one end of an interconnection element, according to another embodiment of the invention.

FIG. 1E illustrates another embodiment of a resilient interconnection element 150 having a soft core 152 and a hard shell 154. In this example, the interconnection element 150 is generally "C-shaped", preferably with a slightly curved tip 150b, and is suitable for making a pressure contact as indicated by the arrow labelled "F".

It should be understood that the soft core can readily be formed into any springable shape—in other words, a shape that will cause a resulting interconnection element to deflect resiliently in response to a force applied at its tip. For example, the core could be Formed into a conventional coil shape. However, a coil shape would not be preferred, due to the overall length of the interconnection element and inductances (and the like) associated therewith and the adverse effect of same on circuitry operating at high frequencies (speeds).

The material of the shell, or at least one layer of a multi-layer shell (described hereinbelow) has a significantly higher yield strength than the material of the core. Therefore, the shell overshadows the core in establishing the mechanical characteristics (e.g., resiliency) of the resulting interconnection structure. Ratios of shell:core yield strengths are preferably at least 2:1, including at least 3:1 and at least 5:1, and may be as high as 10:1. It is also evident that the shell, or at least an outer layer of a multi-layer shell should be electrically conductive, notably in cases where the shell covers the end of the core. (The parent case, however, describes embodiments where the end of the core is exposed, in which case the core must be conductive.)

From an academic viewpoint, it is only necessary that the springing (spring shaped) portion of the resulting composite interconnection element be overcoated with the hard material. From this viewpoint, it is generally not essential that both of the two ends of the core be overcoated. As a practical matter, however, it is preferred to overcoat the entire core. Particular reasons for and advantages accruing to overcoating an end of the core which is anchored (attached) to an electronic component are discussed in greater detail hereinbelow.

Suitable materials for the core (112, 122, 132, 142) include, but are not limited to: gold, aluminum, copper, and their alloys. These materials are typically alloyed with small amounts of other metals to obtain desired physical properties, such as with beryllium, cadmium, silicon, magnesium, and the like. It is also possible to use silver, palladium, platinum; metals or alloys such as metals of the platinum group of elements. Solder constituted from lead, tin, indium, bismuth, cadmium, antimony and their alloys can be used.

Vis-a-vis attaching an end of the core (wire) to a terminal of an electronic component (discussed in greater detail hereinbelow), generally, a wire of any material (e.g., gold) that is amenable to bonding (using temperature, pressure and/or ultrasonic energy to effect the bonding) would be suitable for practicing the invention. It is within the scope of this invention that any material amenable to overcoating (e.g., plating), including non-metallic material, can be used for the core.

Suitable materials for the shell (114, 124, 134, 144) include (and, as is discussed hereinbelow, for the individual layers of a multi-layer shell), but are not limited to: nickel, and its alloys; copper, cobalt, iron, and their alloys; gold (especially hard gold) and silver, both of which exhibit excellent current-carrying capabilities and good contact resistivity/characteristics; elements of the platinum group; noble metals; semi-noble metals and their alloys, particularly elements of the platinum group and their alloys; tungsten and molybdenum. In cases where a solder-like finish is desired, tin, lead, bismuth, indium and their alloys can also be used.

The technique selected for applying these coating materials over the various core materials set forth hereinabove will, of course, vary from application-to-application. Electroplating and electroless plating are generally preferred techniques. Generally, however, it would be counterintuitive to plate over a gold core. According to an aspect of the invention, when plating (especially electroless plating) a nickel shell over a gold core, it is desirable to first apply a thin copper initiation layer over the acid wire stem, in order to facilitate plating initiation.

An exemplary interconnection element, such as is illustrated in FIGS. 1A–1E may have a core diameter of approximately 0.001 inches and a shell thickness of 0.001 inches—the interconnection element thus having an overall diameter of approximately 0.003 inches (i.e., core diameter plus two times the shell thickness). Generally, this thickness of the shell will be on the order of 0.2–5.0 (one-fifth to five) times the thickness (e.g., diameter) of the core.

Some exemplary parameters for composite interconnection elements are:

(a) A gold wire core having a diameter of 1.5 mils is shaped to have an overall height of 40 mils and a generally C-shape curve (compare FIG. 1E) of 9 mils radius, is plated with 0.75 mils of nickel (overall diameter=1.5+2×0.75=3 mils), and optionally receives a final overcoat of 50 microinches of gold (e.g., to lower and enhance contact resistance). The resulting composite interconnection element exhibits a spring constant (k) of approximately 3–5 grams/mil. In use, 3–5 mils of deflection will result in a contact force of 9–25 grams. This example is useful in the context of a spring element for an interposer.

(b) A gold wire core having a diameter or 1.0 mils is shaped to have an overall height of 35 mils, is plated with 1.25 mils of nickel (overall diameter=1.0+2× 1.25=3.5 mils), and optionally receives a final overcoat of 50 microinches of gold. The resulting composite interconnection element exhibits a spring constant (k) of approximately 3 grams/mil, and is useful in the context of a spring element for a probe.

(c) A gold wire core having a diameter of 1.5 mils is shaped to have an overall height of 20 mils and a generally S-shape curve with radii of approximately 5 mils, is plated with 0.75 mils of nickel or copper (overall diameter=1.5+2×0.75=3 mils). The resulting composite interconnection element exhibits a spring constant (k) of approximately 2–3 grams/mil, and is useful in the context of a spring element for mounting on a semiconductor device.

As will be illustrated in greater detail hereinbelow, the core need not have a round cross-section, but may rather be a flat tab (having a rectangular cross-section) extending from a sheet. It should be understood that, as used herein, the term "tab" is not to be confused with the term "TAB" (Tape Automated Bonding).

Multi-Layer Shells

Figure 2A:
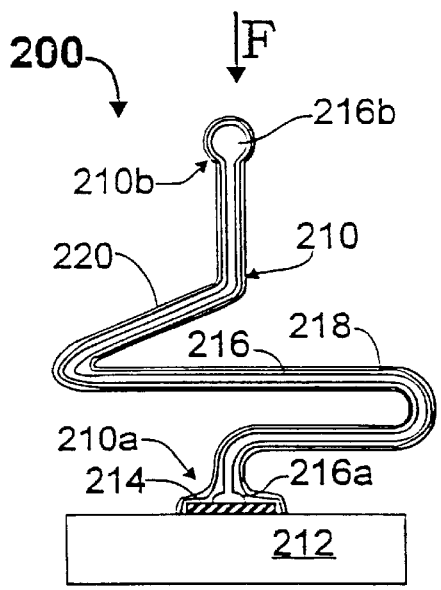
FIG. 2A is a cross-sectional view of an interconnection element mounted to a terminal of an electronic component and having a multi-layered shell, according to the invention.

FIG. 2A illustrates an embodiment 200 of an interconnection element 210 mounted to an electronic component 212 which is provided with a terminal 214. In this example, a soft (e.g., gold) wire core 216 is bonded (attached) at one end 216a to the terminal 214, is configured to extend from the terminal and have a spring shape (compare the shape shown in FIG. 1B), and is severed to have a free end 216b. Bonding, shaping and severing a wire in this manner is accomplished using wirebonding equipment. The bond at the end 216a of the core covers only a relatively small portion of the exposed surface of the terminal 214.

A shell (overcoat) is disposed over the wire core 216 which, in this example, is shown as being multi-layered, having an inner layer 218 and an outer layer 220, both of which layers may suitably be applied by plating processes. One or more layers of the multi-layer shell is (are) formed of a hard material (such as nickel and its alloys) to impart a desired resiliency to the interconnection element 210. For example, the outer layer 220 may be of a hard material, and the inner layer may be of a material that acts as a buffer or barrier layer (or as an activation layer, or as an adhesion layer) in plating the hard material 220 onto the core material 216. Alternatively, the inner layer 218 may be the hard material, and the outer layer 220 may be a material (such as soft cold) that exhibits superior electrical characteristics, including electrical conductivity and solderability. When a solder or braze type contact is desired, the outer layer of the interconnection element may be lead-tin solder or gold-tin braze material, respectively.

Anchoring to a Terminal

FIG. 2A illustrates, in a general manner, another key feature of the invention—namely, that resilient interconnection element can be securely anchored to a terminal on an electronic component. The attached end 210a of the interconnection element will be subject to significant mechanical stress, as a result of a compressive force (arrow "F") applied to the free end 210b of the interconnection element.

As illustrated in FIG. 2A, the overcoat (218, 220) covers not only the core 216, but also the entire remaining (i.e., other than the bond 216a) exposed surface of the terminal 214 adjacent the core 216 in a continuous (non-interrupted) manner. This securely and reliably anchors the interconnection element 210 to the terminal, the overcoat material providing a substantial (e.g., greater than 50%) contribution to anchoring the resulting interconnection element to the terminal. Generally, it is only required that the overcoat material cover at least a portion of the terminal adjacent the core. It is generally preferred, however, that the overcoat material cover the entire remaining surface of the terminal. Preferably, each layer of the shell is metallic.

As a general proposition, the relatively small area at which the core is attached (e.g., bonded) to the terminal is not well suited to accommodating stresses resulting from contact forces ("F") imposed on the resulting composite interconnection element. By virtue of the shell covering the entire exposed surface of the terminal (other than in the relatively small area comprising the attachment of the core end 216a to the terminal), the overall interconnection structure is firmly anchored to the terminal. The adhesion strength, and ability to react contact forces, of the overcoat will far exceed that of the core end (216a) itself.

As used herein, the term "electronic component" (e.g., 212) includes, but is not limited to: interconnect and interposer substrates; semiconductor wafers and dies, made of any suitable semiconducting material such as silicon (Si) or gallium-arsenide (GaAs); production interconnect sockets;

test sockets; sacrificial members, elements and substrates, as described in the parent case; semiconductor packages, including ceramic and plastic packages, and chip carriers; and connectors.

The interconnection element of the present invention is particularly well suited for use as:
- interconnection elements mounted directly to silicon dies, eliminating the need for having a semiconductor package;
- interconnection elements extending as probes from substrates (described in greater detail hereinbelow) for testing electronic components; and
- interconnection elements of interposers (discussed in greater detail hereinbelow).

The interconnection element of the present invention is unique in that it benefits from the mechanical characteristics (e.g., high yield strength) of a hard material without being limited by the attendant typically poor bonding characteristic of hard materials. As elaborated upon in the parent case, this is made possible largely by the fact that the shell (overcoat) functions as a "superstructure" over the "falsework" of the core, two terms which are borrowed from the milieu of civil engineering. This is very different from plated interconnection elements of the prior art wherein the plating is used as a protective (e.g., anti-corrosive) coating, and is generally incapable of imparting the desired mechanical characteristic to the interconnection structure. And this is certainly in marked contrast to any non-metallic, anticorrosive coatings, such as benzotriazole (BTA) applied to electrical interconnects.

Among the numerous advantages of the present invention are that a plurality of free-standing interconnect structures are readily formed on substrates, from different levels thereof such as a PCB having a decoupling capacitor) to a common height above the substrate, so that their free ends are coplanar with one another. Additionally, both the electrical and mechanical (e.g., plastic and elastic) characteristics of an interconnection element formed according to the invention are readily tailored for particular applications. For example, it may be desirable in a given application that the interconnection elements exhibit both plastic and elastic deformation. (Plastic deformation may be desired to accommodate across non-planarities in components being interconnected by the interconnection elements.) When elastic behavior is desired, it is necessary that the interconnection element generate a threshold minimum amount of contact force to effect a reliable contact. It is also advantageous that the tip of the interconnection element makes a wiping contact with a terminal of an electronic component, due to the occasional presence of contaminant films on the contacting surfaces.

As used herein, the term "resilient", as applied to contact structures, implies contact structures (interconnection elements) that exhibit primarily elastic behavior in response to an applied load (contact force), and the term "compliant" implies contact structures (interconnection elements) that exhibit both elastic and plastic behavior in response to an applied load (contact force). As used herein, a "compliant" contact structure is a "resilient" contact structure. The composite interconnection elements of the present invention are a special case of either compliant or resilient contact structures.

A number of features are elaborated upon in detail, in the parent case, including, but not limited to: fabricating the interconnection elements on sacrificial substrates; gang-transferring a plurality of interconnection elements to an electronic component; providing the interconnection elements with contact tips, preferably with a rough surface finish; employing the interconnection elements on an electronic component to make temporary, then permanent connections to the electronic component; arranging the interconnection elements to have different spacing at their one ends than at their opposite ends; fabricating spring clips and alignment pins in the same process steps as fabricating the interconnection elements; employing the interconnection elements to accommodate differences in thermal expansion between connected components; eliminating the need for discrete semiconductor packages (such as for SIMMs); and optionally soldering resilient interconnection elements (resilient contact structures).

Controlled Impedance

Figure 2B:
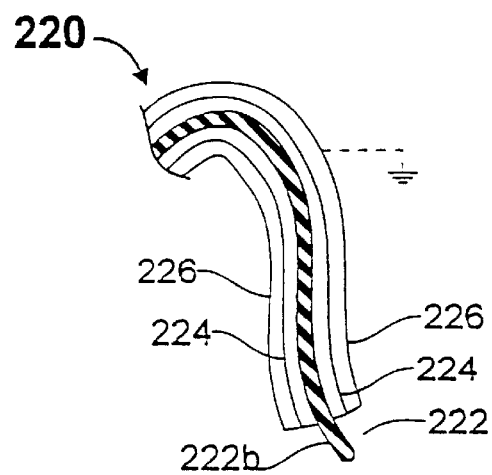
FIG. 2B is a cross-sectional view of an interconnection element having a multi-layered shell, wherein an intermediate layer is of a dielectric material, according to the invention.

FIG. 2B shows a composite interconnection element 220 having multiple layers. An innermost portion (inner elongate conductive element) 222 of the interconnection element 220 is either an uncoated core or a core which has been overcoated, as described hereinabove. The tip 222b of the innermost portion 222 is masked with a suitable masking material (not shown). A dielectric layer 224 is applied over the innermost portion 222 such as by an electrophoretic process. An outer layer 226 of a conductive material is applied over the dielectric layer 224.

In use, electrically grounding the outer layer 226 will result in the interconnection element 220 having controlled impedance. An exemplary material for the dielectric layer 224 is a polymeric material, applied in any suitable manner and to any suitable thickness (e.g., 0.1–3.0 mils).

The outer layer 226 may be multi-layer. For example, in instances wherein the innermost portion 222 is an uncoated core, at least one layer of the outer layer 226 is a spring material, when it is desired that the overall interconnection element exhibit resilience.

Altering Pitch

Figure 2C:
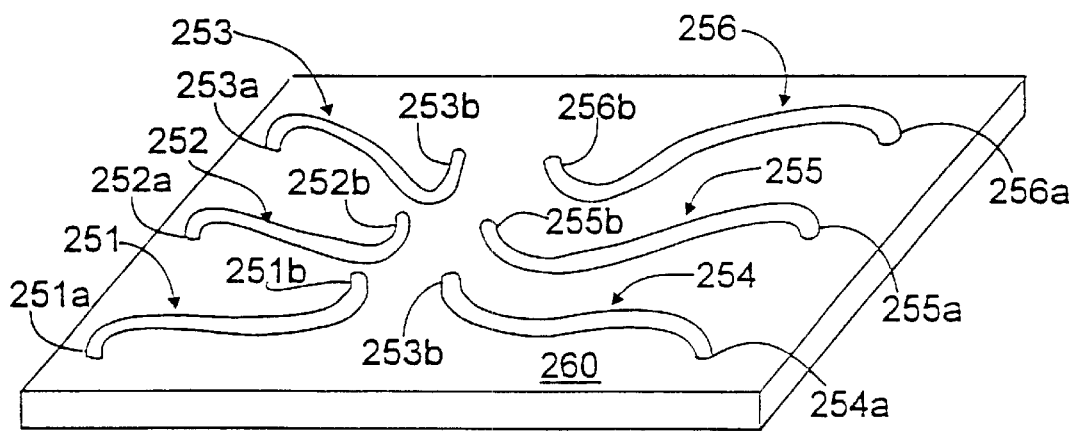
FIG. 2C is a perspective view of a plurality of interconnection elements mounted to an electronic component (e.g., a probe card insert), according to the invention.

FIG. 2C illustrates an embodiment 250 wherein a plurality (six of many shown) of interconnection elements 251 . . . 256 are mounted on a surface of an electronic component 260, such as a probe card insert (a subassembly mounted in a conventional manner to a probe card). Terminals and conductive traces of the probe card insert are omitted from this view, for illustrative clarity. The attached ends 251a . . . 256a of the interconnection elements 251 . . . 256 originate at a first pitch (spacing), such as 0.05–0.10 inches. The interconnection elements 251 . . . 256 are shaped and/or oriented so that their free ends (ties) are at a second, finer pitch, such as 0.005–0.010 inches. An interconnect assembly which makes interconnections from a one pitch to another pitch is typically referred to as a "space transformer".

As illustrated, the tips 251b . . . 256b of the interconnection elements are arranged in two parallel rows, such as for making contact to (for testing and/or burning in) a semiconductor device having two parallel rows of bond pads (contact points). The interconnection elements can be arranged to have other tip patterns, for making contact to electronic components having other contact point patterns, such as arrays.

Generally, throughout the embodiments disclosed herein, although only one interconnection element may be shown, the invention is applicable to fabricating a plurality of interconnection components and arranging the plurality of interconnection elements in a prescribed spatial relationship with one another, such as in a peripheral pattern or in a rectangular array pattern.

Use of Sacrificial Substrates

The mounting of interconnection elements directly to terminals of electronic components has been discussed hereinabove. Generally speaking, the interconnection elements of the present invention can be fabricated upon, or mounted to, any suitable surface of any suitable substrate, including sacrificial substrates.

Attention is directed to the PARENT CASE, which describes, for example with respect to FIGS. 11A–11F fabricating a plurality of interconnection structures (e.g., resilient contact structures) as seoarate and distinct structures for subsequent mounting to electronic components, and which describes with respect to FIGS. 12A–12C mounting a plurality of interconnection elements to a sacrificial substrate (carrier) then transferring the plurality of interconnection elements en masse to an electronic component.

Figure 2D:
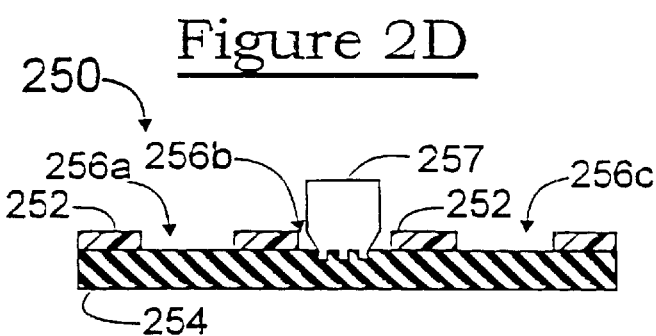
FIG. 2D is a cross-sectional view of an exemplary first step of a technique for manufacturing interconnection elements, according to the invention.
Figure 2E:
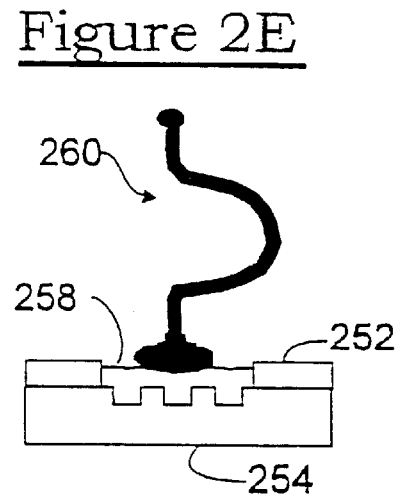
FIG. 2E is a cross-sectional view of an exemplary further step of the technique of FIG. 2D for manufacturing interconnection elements, according to the invention.
Figure 2F:
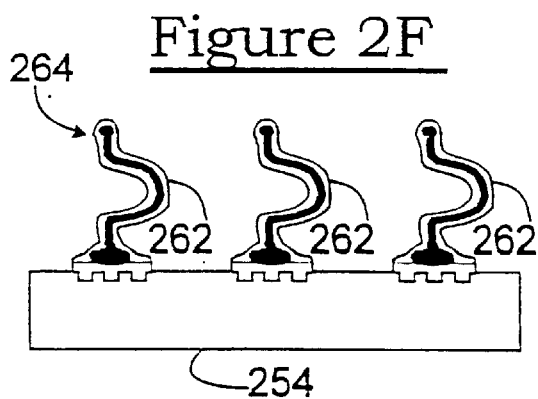
FIG. 2F is a cross-sectional view of an exemplary further step of the technique of FIG. 2E for manufacturing interconnection elements, according to the invention.

FIGS. 2D–2F illustrate a technique for fabricating a plurality of interconnection elements having preformed tip structures, using a sacrificial substrate.

FIG. 2D illustrates a first step of the technique 250, in which a patterned layer of masking material 252 is applied onto a surface of a sacrificial substrate 254. The sacrificial substrate 254 may be of thin (1–10 mil) copper or aluminum foil, by way of example, and the masking material 252 may be common photoresist. The masking layer 252 is patterned to have a plurality (three of many shown) of openings at locations 256a, 256b, 256c whereat it is desired to fabricate interconnection elements. The locations 256a, 256b and 256c are, in this sense, comparable to the terminals of an electronic component. The locations 256a, 256b and 256c are preferably treated at this stage to have a rough or featured surface texture. As shown, this may be accomplished mechanically with an embossing tool 257 forming depressions in the foil 254 at the locations 256a, 256b and 256c. Alternatively, the surface of the foil at these locations can be chemically etched to have a surface texture. Any technique suitable for effecting this general purpose is within the scope of this invention, for example sand blasting, peening and the like.

Next, a plurality (one of many shown) of conductive tip structures 258 are formed at each location (e.g., 256b), as illustrated by FIG. 2E. This may be accomplished using any suitable technique, such as electroplating, and may include tip structures having multiple layers of material. For example, the a tip structure 258 may have a thin (e.g., 10–100 microinch) barrier layer of nickel applied onto the sacrificial substrate, followed by a thin (e.g., 10 microinch) layer of soft gold, followed by a thin (e.g., 20 microinch) layer of hard gold, followed by a relatively thick (e.g., 200 microinch) layer of nickel, followed by a final thin (e.g., 100 microinch) layer of soft gold. Generally, the first thin barrier layer of nickel is provided to protect the subsequent layer of gold from being "poisoned" by the material (e.g., aluminum, copper) of the substrate 254, the relatively thick layer of nickel is to provide strength to the tip structure, and the final thin layer of soft gold provides a surface which is readily bonded to. The invention is not limited to any particulars of how the tip structures are formed on the sacrificial substrate, as these particulars would inevitably vary from application-to-application.

As illustrated by FIG. 2E, a plurality (one of many shown) of cores 250 for interconnection elements may be formed on the tip structures 258, such as by any of the techniques of bonding a soft wire core to a terminal of an electronic component described hereinabove. The cores 260 are then overcoated with a preferably hard material 262 in the manner described hereinabove, and the masking material 252 is then removed, resulting in a plurality (three of many shown) of free-standing interconnection elements 264 mounted to a surface of the sacrificial substrate, as illustrated by FIG. 2F.

In a manner analogous to the overcoat material covering at least the adjacent area of a terminal (214) described with respect to FIG. 2A, the overcoat material 262 firmly anchors the cores 260 to their respective tip structures 258 and, if desired, imparts resilient characteristics to the resulting interconnection elements 264. As noted in the PARENT CASE, the plurality of interconnection elements mounted to the sacrificial substrate may be gang-transferred to terminals of an electronic component. Alternatively, two widely divergent paths may be taken.

It is within the scope of this invention that a silicon wafer can be used as the sacrificial substrate upon which tip structures are fabricated, and that tip structures so fabricated may be joined (e.g., soldered, brazed) to resilient contact structures which already have been mounted to an electronic component. Further discussion of these techniques are found in FIGS. 8A–8E, hereinbelow.

Figure 2G:
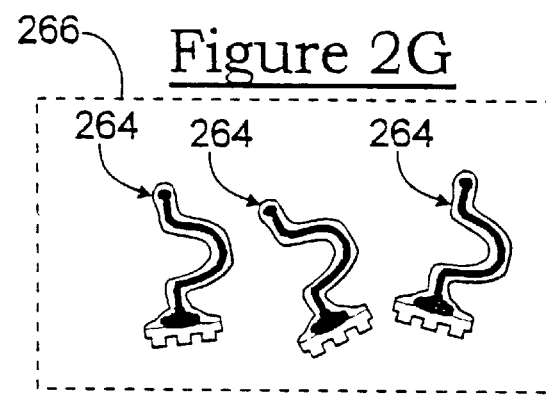
FIG. 2G is a cross-sectional view of an exemplary plurality of individual interconnection elements fabricated according to the technique of FIGS. 2D–2F, according to the invention.

As illustrated by FIG. 2G, the sacrificial substrate 254 may simply be removed, by any suitable process such as selective chemical etching. Since most selective chemical etching processes will etch one material at a much greater rate than an other material, and the other material may slightly be etched in the process, this phenomenon is advantageously employed to remove the thin barrier layer of nickel in the tip structure contemporaneously with removing the sacrificial substrate. However, if need be, the thin nickel barrier layer can be removed in a subsequent etch step. This results in a plurality (three of many shown) of individual, discrete, singulated interconnection elements 264, as indicated by the dashed line 266, which may later be mounted (such as by soldering or brazing) to terminals on electronic components.

It bears mention that the overcoat material may also be slightly thinned in the process of removing the sacrificial substrate and/or the thin barrier layer. However, it is preferred that this not occur.

To prevent thinning of the overcoat, it is preferred that a thin layer of gold or, for example, approximately 10 microinches of soft gold applied over approximately 20 microinches of hard gold, be applied as a final layer over the overcoat material 262. Such an outer layer of gold is intended primarily for its superior conductivity, contact resistance, and solderability, and is generally highly impervious to most etching solutions contemplated to be used to remove the thin barrier layer and the sacrificial substrate.

Figure 2H:
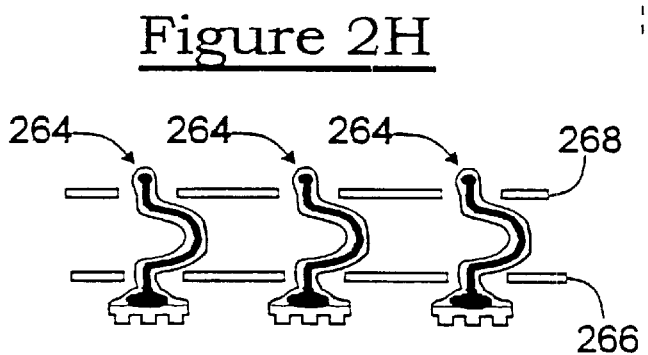
FIG. 2H is a cross-sectional view of an exemplary plurality of interconnection elements fabricated according to the technique of FIGS. 2D–2F, and associated in a prescribed spatial relationship with one another, according to the invention.

Alternatively, as illustrated by FIG. 2H, prior to removing the sacrificial substrate 254, the plurality (three of many shown) of interconnection elements 264 may be "fixed" in a desired spatial relationship with one another by any suitable support structure 266, such as by a thin plate having a plurality of holes therein, whereupon the sacrificial substrate is removed. The support structure 266 may be of a dielectric material, or of a conductive material overcoated with a dielectric material. Further processing steps (not illustrated) such as mounting the plurality of interconnection elements to an electronic component such as a silicon wafer or a printed circuit board may then proceed. Additionally, in some applications, it may be desireable to stabilize the tips (opposite the tip structures) of the interconnection elements 264 from moving, especially when contact forces are applied thereto. To this end, it may also be desirable to constrain movement of the tips of the interconnection elements with a suitable sheet 268 having a plurality of holes, such as a mesh formed of a dielectric material.

A distinct advantage of the technique 250 described hereinabove is that tip structures (258) may be formed of virtually any desired material and having virtually any desired texture. As mentioned hereinabove, gold is an example of a noble metal that exhibits excellent electrical characteristics of electrical conductivity, low contact resistance, solderability, and resistance to corrosion. Since gold is also malleable, it is extremely well-suited to be a final overcoat applied over any of the interconnection elements described herein, particularly the resilient interconnection elements described herein. Other noble metals exhibit similar desirable characteristics. However, certain materials such as rhodium which exhibit such excellent electrical characteristics would generally be inappropriate for overcoating an entire interconnection element. Rhodium, for example, is notably brittle, and would not perform well as a final overcoat on a resilient interconnection element. In this regard, techniques exemplified by the technique 250 readily overcome this limitation. For example, the first layer of a multi-layer tip structure (see 258) can be rhodium (rather than gold, as described hereinabove), thereby exploiting its superior electrical characteristics for making contact to electronic components without having any impact whatsoever on the mechanical behavior of the resulting interconnection element.

Figure 2I:
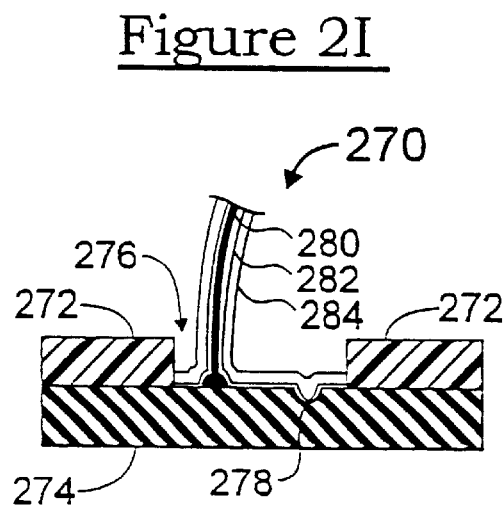
FIG. 2I is a cross-sectional view of an alternate embodiment for manufacturing interconnection elements, showing a one end of one element, according to the invention.

FIG. 2I illustrates an alternate embodiment 270 for fabricating interconnection elements. In this embodiment, a masking material 272 is applied to the surface of a sacrificial substrate 274, and is patterned to have a plurality (one of many shown) of openings 276, in a manner similar to the technique described hereinabove with respect to FIG. 2D. The openings 276 define areas whereat interconnection elements will be fabricated as free-standing structures. (As used throughout the descriptions set forth herein, an interconnection element is "free-standing" when is has a one end bonded to a terminal of an electronic component or to an area of a sacrificial substrate, and the opposite end of the interconnection element is not bonded to the electronic component or sacrificial substrate.)

The area within the opening may be textured, in any suitable manner, such as to have one or more depressions, as indicated by the single depression 278 extending into the surface of the sacrificial substrate 274.

A core (wire stem) 280 is bonded to the surface of the sacrificial substrate within the opening 276, and may have any suitable shape. In this illustration, only a one end of one interconnection element is shown, for illustrative clarity. The other end (not shown) may be attached to an electronic component. It may now readily be observed that the technique 270 differs from the aforementioned technique 250 in that the core 280 is bonded directly to the sacrificial substrate 274, rather than to a tip structure 258. By way of example, a gold wire core (280) is readily bonded, using conventional wirebonding techniques, to the surface of an aluminum substrate (274).

In a next step of the process (270), a layer 282 of gold is applied (e.g., by plating) over the core 280 and onto the exposed area of the substrate 274 within the opening 276, including within the depression 278. The primary purpose of this layer 282 is to form a contact surface at the end of the resulting interconnection element (i.e., once the sacrificial substrate is removed).

Next, a layer 284 of a relatively hard material, such as nickel, is applied over the layer 282. As mentioned hereinabove, one primary purpose of this layer 284 is to impart desired mechanical characteristics (e.g., resiliency) to the resulting composite interconnection element. In this embodiment, another primary purpose of the layer 284 is to enhance the durability of the contact surface being fabricated at the lower (as viewed) end of the resulting interconnection element. A final layer of cold (not shown) may be applied over the layer 284, to enhance the electrical characteristics of the resulting interconnection element.

In a final step, the masking material 272 and sacrificial substrate 274 are removed, resulting in either a plurality of singulated interconnection elements (compare FIG. 2G) or in a plurality of interconnection elements having a predetermined spatial relationship with one another (compare FIG. 2H).

This embodiment 270 is exemplary of a technique for fabricating textured contact tips on the ends of interconnection elements. In this case, an excellent example of a "gold over nickel" contact tip has been described. It is, however, within the scope of the invention that other analogous contact tips could be fabricated at the ends of interconnection elements, according to the techniques described herein. Another feature of this embodiment 270 is that the contact tips are constructed entirely atop the sacrificial substrate (274), rather than within the surface of the sacrificial substrate (254) as contemplated by the previous embodiment 250.

Interposers, Generally

The techniques described hereinabove generally set forth a novel technique for fabricating composite interconnection elements, the physical characteristics of which are readily tailored to exhibit a desired degree of resiliency.

Generally, the composite interconnection elements of the present invention are readily mounted to (or fabricated upon) a substrate which will function as an interposer, disposed between and interconnecting two electronic components, one of the two electronic components disposed on each side of the interposer. The fabrication and use of the composite interconnection elements in interposers is discussed, in detail, in the aforementioned commonly-owned, copending U.S. patent application Ser. No. 08/526, 426.

The techniques described hereinabove generally set forth a novel technique for fabricating composite interconnection elements, the physical characteristics of which are readily tailored to exhibit a desired degree of resiliency, and the ability to fabricate interposers using such composite interconnection elements.

Generally, the composite interconnection elements of the present invention are readily mounted to (or fabricated upon) a substrate in a manner in which the tips of the interconnection elements are arranged to make contact with selected areas (e.g., bond pads) of semiconductor devices.

The PARENT CASE discloses various techniques for probing semiconductor devices.

The subject of using the interconnection elements of the invention in interposers has been mentioned hereinabove. Generally, as used herein, an "interposer" is a substrate having contacts on two opposite surfaces thereof, disposed between two electronic components to interconnect the two electronic components. Often, it is desirable that the interposer permit at least one of the two interconnected electronic components to be removed (e.g., for replacement, upgrading, and the like).

Interposer Embodiment #1

Figure 3A:
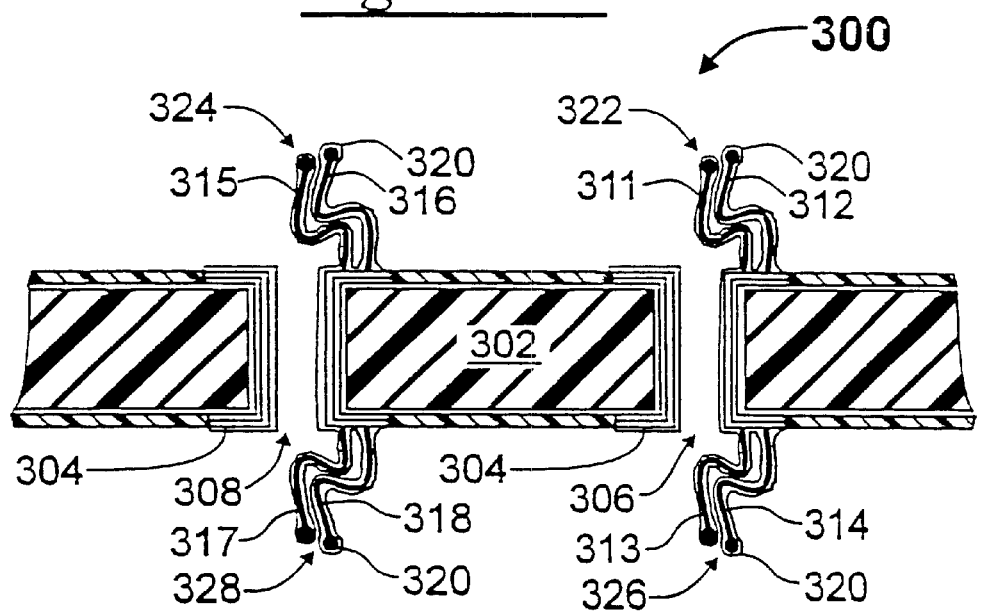
FIG. 3A is a cross-sectional view of an embodiment of an interposer, according to the invention.

FIG. 3A illustrates an embodiment 300 of an interposer, using the interconnection elements of the invention. Generally, an insulating substrate 302, such as a PCB-type substrate, is provided with a plurality (two of many shown) of electrically conductive through holes (e.g., plated vias) 306, 308, or the like, each having conductive portions exposed on the top (upper) 302a and bottom (lower) 302b surfaces of the insulating substrate 302.

A pair of soft cores 311 and 312 are attached to the exposed portion of the through hole 306 on the top surface 302a of the substrate 302. A pair of soft cores 313 and 314 are attached to the exposed portion of the through hole 306 on the bottom surface of the substrate 302. Similarly, a pair of soft cores 315 and 316 are attached to the exposed portion of the through hole 308 on the top surface of the substrate 302, and a pair of soft cores 317 and 318 are attached to the exposed portion of the through hole 308 on the bottom surface of the substrate 302. The cores 311 ... 318 are then overcoated with a hard material 320 to form interconnect structures 322 and 324 on the top surface 302a of the substrate 302 and to form interconnect structures 326 and 328 on the bottom surface 302b of the substrate 302. In this manner, the individual cores 311 ... 318 are securely anchored to the respective exposed portions of the through holes, the interconnecting structure 322 is electrically connected to the interconnecting structure 326, and the interconnecting structure 324 is electrically connected to the interconnecting structure 328. It will be understood that by providing each interconnecting structure (e.g., 322) as a pair of interconnecting elements (e.g., 311, 312), that more reliable connections to external components (not shown) are effected (i.e., than with single interconnecting elements).

As is shown, the top group of interconnection elements 311, 312, 315 and 316 are all formed with the same shape, and the bottom group of interconnection elements all have the same shape. It should be understood that the bottom group of interconnection elements can be provided with a shape which is different than the top group of interconnection elements, which would provide the opportunity to create interconnecting structures extending from the top surface of the insulating substrate having dissimilar mechanical characteristics from the interconnecting structures extending from the bottom surface of the substrate.

Interposer Embodiment #2

Figure 3B:
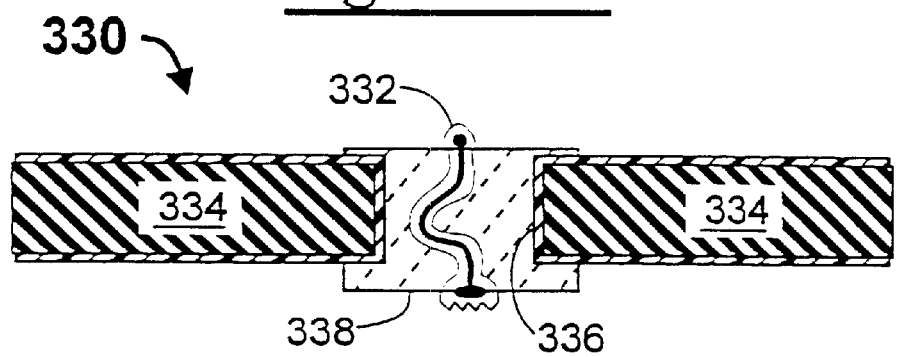
FIG. 3B is a cross-sectional view of another embodiment of an interposer, according to the invention.

FIG. 3B illustrates another embodiment 330 of an interposer using the interconnection elements of the invention. In this embodiment, a plurality (one of many shown) of interconnection elements 332 are fabricated in a desired pattern (e.g., an array) on a sacrificial substrate (not shown). A support substrate 334 is provided with a like plurality of holes 336 in a corresponding pattern. The support substrate 334 is placed over the interconnection elements 332 so that the interconnection elements 332 extend through the holes 336. The interconnection elements 332 are loosely held within the support substrate by a suitable material 338 (such as an elastomer) filling the holes 336, and extend from both the top and bottom surfaces of the support substrate. The sacrificial substrate is then removed. Evidently, the support substrate 334 (compare 266) can simply be "dropped" onto a plurality of interconnection elements (compare 264) which are mounted to a sacrificial substrate (254) in the process of fabricating this interposer assembly.

Interposer Embodiment #3

Figure 3C:
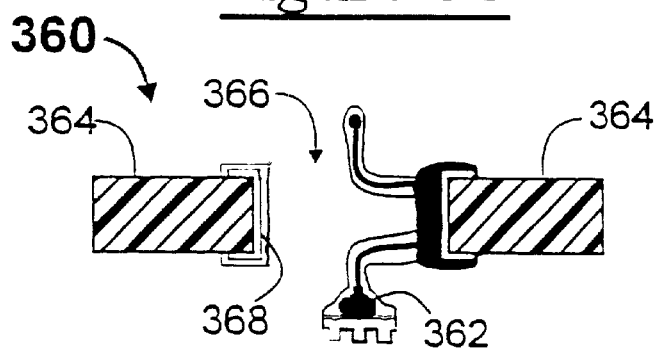
FIG. 3C is a cross-sectional view of another embodiment of an interposer, according to the invention.

FIG. 3C illustrates another embodiment 360 of an interposer using the interconnection elements of the invention. This embodiment 360 is similar to the previously-described embodiment 330, with the exception that the interconnect structure 362 (compare 332) is supported within the holes 366 (compare 336) of the support substrate 364 (compare 334) by soldering middle portions of the interconnection structures 362 to plating 368 on the through holes 366 the support substrate. Again, the support substrate 364 (compare 266) can simply be "dropped" onto a plurality of interconnection elements (compare 264) which are mounted to a sacrificial substrate (254) in the process of fabricating this interposer assembly.

FIGS. 3B and 3C are illustrative of the fact that a single interconnection element (332, 362) can be used to effect a single connection of respective terminals of two electronic components. It should be understood, and is within the scope of this invention, that any conductive element could be used in lieu of the interconnection element of the present invention, as illustrated by FIGS. 3B and 3C.

It should be understood that, in the interposer embodiments of FIGS. 3A, 3B and 3C, electronic components (not shown) would be disposed on both sides of the interposer (300, 330, 360) in order that the interposer make electrical connection between terminals (not shown) thereof.

Forming Interconnection Elements from Sheets

The discussion hereinabove has focused mainly on forming interconnection elements from soft wire cores which are shared and overcoated with a hard material. The present invention is also applicable to forming interconnection elements which are formed of soft metal sheets which are patterned (such as by stamping or etching), into flat elongate elements (tabs, ribbons) and overcoated with a hard material. This subject is elaborated upon in the aforementioned U.S. patent application Ser No. 08/526,246.

Space Transformer

FIGS. 3A–3C, set forth immediately hereinabove, describe interposers and techniques for making same, as are applicable (suitable) to the present invention. Although, in the main, the composite interconnection elements of the present invention have been discussed, it should clearly be understood that any resilient interconnection element (spring) can be employed, including spring structures made of monolithic materials that are inherently springy made of phosphor bronze and beryllium copper.

"Space transforming" (sometimes referred to as "pitch spreading") is an important concept applicable to the present invention. Simply stated, it is important that the tips of the resilient contact structures be more closely spaced to one another (relatively fine pitch) than connections to their bases. As illustrated in FIG. 2C, discussed hereinabove, this can be accomplished by shaping and orienting the individual spring elements (251 ... 256) to converge upon one another, resulting in a tendency for the individual resilient contact structures to have dissimilar lengths. Generally, in the context of a probe card assembly, it is very important for all of the probe elements (resilient contact structures) to have the same length as one another, to ensure constancy in the plurality of signal paths involved.

Figure 4:
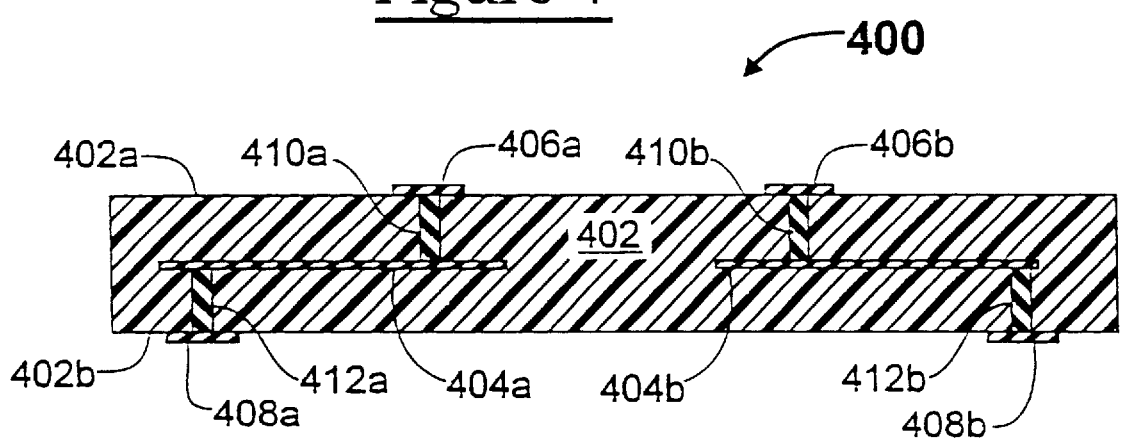
FIG. 4 is a cross-sectional view of an embodiment of a generic space transformer, according to the invention.

FIG. 4 illustrates an exemplary design of a space transformer 400, according to the present invention, wherein the desired space-transforming is accomplished by the substrate 402 of the space transformer rather than in the shaping of the individual resilient contact structures (not shown) attached thereto.

The space transformer substrate 402 has a top (as viewed) surface 402a and a bottom (as viewed) surface 402b, and is preferably formed as a multi-layer component having alternating layers of insulating material (e.g., ceramic) and conductive material. In this example, one wiring layer is shown as including two (of many) conductive traces 404a and 404b.

A plurality (two of many shown) of terminals 406a and 406b are disposed on the top surface 402a of the space transformer substrate 402 at a relatively fine pitch (relatively close to one another). A plurality (two of many shown) of terminals 408a and 408b are disposed on the bottom surface 402b of the space transformer substrate 402 at a relatively coarse pitch (relative to the terminals 406a and 406b, further apart from one another). For example, the bottom terminals 408a and 408b may be disposed at a 50–100 mil pitch (comparable to printed circuit board pitch constraints), and the top terminals 406a and 406b may be disposed as a 5–10 mil pitch (comparable to the center-to-center spacing of semiconductor die bond pads), resulting in a 10:1 pitch-transformation. The top terminals 406a and 406b are connected to the corresponding bottom terminals 408a and 408b, respectively, by associated conductors 410a/412a and 410b/412b, respectively, connecting the terminals to the conductive traces 404a and 404b, respectively. This is all generally well known, in the context of multi-layer land arid array (LGA) support substrates, and the like.

Probe Card Assembly

Figure 5:
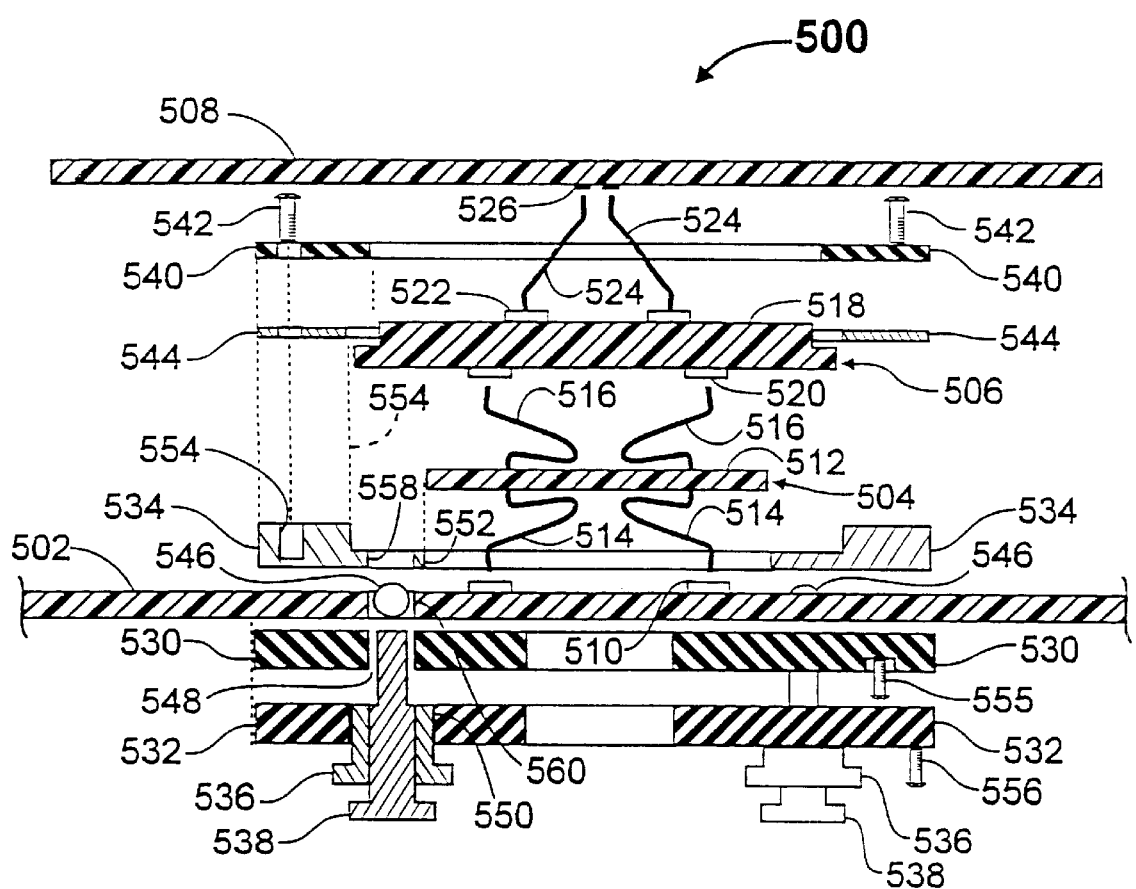
FIG. 5 is an exploded view, partially in cross-section, of the probe card assembly of the present invention.

FIG. 5 illustrates an embodiment of a probe card assembly 500 which includes as its major functional components a probe card 502, an interposer 504 and a space transformer 506, and which is suitable in use for making temporary interconnections to a semiconductor wafer 508. In this exploded, cross-sectional view, certain elements of certain components are shown exaggerated, for illustrative clarity. However, the vertical (as shown) alignment of the various components is properly indicated by the dashed lines in the figure. It should be noted that the interconnection elements (514, 516, 524, discussed in greater detail hereinbelow) are shown in full, rather than in section.

The probe card 502 is generally a conventional circuit board substrate having a plurality (two of many shown) of contact areas (terminals) 510 disposed on the top (as viewed) surface thereof. Additional components (not shown) may be mounted to the probe card, such as active and passive electronic components, connectors, and the like. The terminals 510 on the circuit board may typically be arranged at a 100 mil pitch (pitch is defined hereinabove). The probe card 502 is suitably round, having a diameter on the order of 12 inches.

The interposer 504 includes a substrate 512 (compare the substrate 302). In the manner described hereinabove, a plurality (two of many shown) of resilient interconnection elements 514 are mounted (by their proximal ends) to and extend downward (as viewed) from the bottom (as viewed) surface of the substrate 512, and a corresponding plurality (two of many shown) of resilient interconnection elements 516 are mounted (by their proximal ends) to and extend upward (as viewed) from the top (as viewed) surface of the substrate 512. Any of the aforementioned spring shapes are suitable for the resilient interconnection elements 514 and 516, which are preferably the composite interconnection elements of the present invention. As a general proposition, the tips (distal ends) of both the lower plurality 514 and of the upper plurality 516 of interconnection elements 514 and 516 are at a pitch which matches that of the terminals 510 of the probe card 502, for example 100 mils.

The interconnection elements 514 and 516 are illustrated with exaggerated scale, for illustrative clarity. Typically, the interconnection elements 514 and 516 would extend to an overall height of 20–100 mils from respective bottom and top surfaces of the interposer substrate 512. Generally, the height of the interconnection elements is dictated by the amount of compliance desired.

The space transformer 506 includes a suitable circuitized substrate 518 (compare 402, described hereinabove), such as a multi-layer ceramic substrate having a plurality (two of many shown) of terminals (contact areas, pads) 520 disposed on the lower (as viewed) surface thereof and a plurality (two of many shown) of terminals (contact areas, pads) 522 disposed on the upper (as viewed) surface thereof. In this example, the lower plurality of contact pads 520 is disposed at the pitch of the tips of the interconnection elements 516 (e.g., 100 mils), and the upper plurality of contact pads 522 is disposed at a finer (closer) pitch (e.g., 50 mils). These resilient interconnection 514 and 516 elements are preferably, but not necessarily, the composite interconnection elements of the present invention (compare 210, hereinabove).

A plurality (two of many shown) of resilient interconnection elements 524 ("probes", "probe elements") are mounted (by their proximal ends) directly (i.e., without the intermediary of additional materials such as wires connecting the probe elements to the terminals, or brazing or soldering the probe elements to the terminals) to the terminals (contact pads) 522 and extend upward (as viewed) from the top (as viewed) surface of the space transformer substrate 518. As illustrated, these resilient interconnection elements 524 are suitably arranged so that their tips (distal ends) are spaced at an even finer pitch (e.g., 10 mils) than their proximal ends, thereby augmenting the pitch reduction of the space transformer 506. These resilient contact structures (interconnection elements) 524 are preferably, but not necessarily, the composite interconnection elements of the present invention (compare 210, hereinabove).

It is within the scope of the invention that the probe elements (524) can be fabricated on a sacrificial substrate (compare FIGS. 2D–2F) and subsequently individually mounted (compare FIG. 2G) or gang-transferred (compare FIG. 2H) to the terminals (522) of the space transformer component (506).

As is known, a semiconductor wafer 508 includes a plurality of die sites (not shown) formed by photolithography, deposition, diffusion, and the like, on its front (lower, as viewed) surface. Typically, these die sites are fabricated to be identical to one another. However, as is known, flaws in either the wafer itself or in any of the processes to which the wafer is subjected to form the die sites, can result in certain die sites being non-functional, according to well established test criteria. Often, due to the difficulties attendant probing die sites prior to singulating semiconductor dies from a semiconductor wafer, testing is performed after singulating and packaging the semiconductor dies. When a flaw is discovered after packaging the semiconductor die, the net loss is exacerbated by the costs attendant to packaging the die. Semiconductor wafers typically have a diameter of at least 6 inches, including at least 8 inches.

Each die site typically has a number of contact areas (e.g., bond pads), which may be disposed at any location and in any pattern on the surface of the die site. Two (of many) bond pads 526 of a one of the die sites are illustrated in the figure.

A limited number of techniques are known for testing the die sites, prior to singulating the die sites into individual semiconductor dies. A representative prior art technique involves fabricating a probe card insert having a plurality of tungsten "needles" embedded in and extending from a ceramic substrate, each needle making a temporary connection to a given one of the bond pads. Such probe card inserts are expensive and somewhat complex to manufacture, resulting in their relatively high cost and in a significant lead time to obtain. Given the wide variety of bond pad arrangements that are possible in semiconductor dies, each unique arrangement requires a distinct probe card insert.

The rapidity with which unique semiconductor dies are manufactured highlights the urgent need for probe card inserts that are simple and inexpensive to manufacture, with a short turnaround time. The use of an interposer (504), and a space transformer (506) as a probe card insert, squarely addresses this compelling need.

In use, the interposer 504 is disposed on the top (as viewed) surface of the probe card 502, and the space transformer 506 is stacked atop (as viewed) the interposer 504 so that the interconnection elements 514 make a reliable pressure contact with the contact terminals 510 of the probe card 502, and so that the interconnection elements 516 make a reliable pressure contact with the contact pads 520 of the space transformer 506. Any suitable mechanism for stacking these components and for ensuring such reliable pressure contacts may be employed, a suitable one of which is described hereinbelow.

The probe card assembly 500 includes the following major components for stacking the interposer 506 and the space transformer 506 onto the probe card 502:

- a rear mounting plate 530 made of a rigid material such as stainless steel,
- an actuator mounting plate 532 made of a rigid material such as stainless steel,
- a front mounting plate 534 made of a rigid material such as stainless steel,
- a plurality (two of many shown, three is preferred) of differential screws including an outer differential screw element 536 and an inner differential screw element 538,
- a mounting ring 540 which is preferably made of a springy material such as phosphor bronze and which has a pattern of springy tabs (not shown) extending therefrom,
- a plurality (two of many shown) of screws 542 for holding the mounting ring 538 to the front mounting plate 534 with the space transformer 506 captured therebetween,
- optionally, a spacer ring 544 disposed between the mounting ring 540 and the space transformer 506 to accommodate manufacturing tolerances, and
- a plurality (two of many shown) of pivot spheres 546 disposed atop (as viewed) the differential screws (e.g., atop the inner differential screw element 538).

The rear mounting plate 530 is a metal plate or ring (shown as a ring) disposed on the bottom (as shown) surface of the probe card 502. A plurality (one of many shown) of holes 548 extend through the rear mounting plate.

The actuator mounting plate 532 is a metal plate or ring (shown as a ring) disposed on the bottom (as shown) surface of the rear mounting plate 530. A plurality (one of many shown) of holes 550 extend through the actuator mounting plate. In use, the actuator mounting plate 532 is affixed to the rear mounting plate 530 in any suitable manner, such as with screws (omitted from the figure for illustrative clarity).

The front mounting plate 534 is a rigid, preferably metal ring. In use, the front mounting plate 534 is affixed to the rear mounting plate 530 in any suitable manner, such as with screws (omitted from the figure for illustrative clarity) extending through corresponding holes (omitted from the figure for illustrative clarity) through the probe card 502, thereby capturing the probe card 502 securely between the front mounting plate 534 and rear mounting plate 530.

The front mounting plate 534 has a flat bottom (as viewed) surface disposed against the top (as viewed) surface of the probe card 502. The front mounting plate 534 has a large central opening therethrough, defined by an inner edge 552 the thereof, which is sized to permit the plurality of contact terminals 510 of the probe card 502 to reside within the central opening of the front mounting plate 534, as shown.

As mentioned, the front mounting plate 534 is a ring-like structure having a flat bottom (as viewed) surface. The top (as viewed) surface of the front mounting plate 534 is stepped, the front mounting plate being thicker (vertical extent, as viewed) in an outer region thereof than in an inner region thereof. The step, or shoulder is located at the position of the dashed line (labelled 554), and is sized to permit the space transformer 506 to clear the outer region of the front mounting plate and rest upon the inner region of the front mounting plate 534 (although, as will be seen, the space transformer actually rests upon the pivot spheres 546).

A plurality (one of many shown) of holes 554 extend into the outer region of the front mounting plate 534 from the top (as viewed) surface thereof at least partially through the front mounting plate 534 (these holes are shown extending only partially through the front mounting plate 534 in the figure) which, as will be seen, receive the ends of a corresponding plurality of the screws 542. To this end, the holes 554 are threaded holes. This permits the space transformer 506 to be secured to the front mounting plate by the mounting ring 540, hence urged against the probe card 502.

A plurality (one of many shown) of holes 558 extend completely through the thinner, inner region of the front mounting plate 534, and are aligned with a plurality (one of many shown) of corresponding holes 560 extending through the probe card 502 which, in turn, are aligned with the holes 548 in the rear mounting plate and the holes 550 in the actuator mounting plate 538.

The pivot spheres 546 are loosely disposed within the aligned holes 558 and 560, at the top (as viewed) end of the inner differential screw elements 538. The outer differential screw elements 536 thread into the (threaded) holes 550 of the actuator mounting plate 532, and the inner differential screw elements 538 thread into a threaded bore of the outer differential screw elements 536. In this manner, very fine adjustments can be made in the positions of the individual pivot spheres 546. For example, the outer differential screw elements 536 have an external thread of 72 threads-per-inch, and the inner differential screw elements 538 have an external thread of 80 threads-per inch. By advancing an outer differential screw element 536 one turn into the actuator mounting plate 532 and by holding the corresponding inner differential screw element 538 stationary (with respect to the actuator mounting plate 532), the net change in the position of the corresponding pivot sphere 546 will be 'plus' $\frac{1}{72}$ (0.0139) 'minus' $\frac{1}{80}$ (0.0125) inches, or 0.0014 inches. This permits facile and precise adjustment of the planarity of the space transformer 506 vis-a-vis the probe card 502. Hence, the positions of the tips (top ends, as viewed) of the probes (interconnection elements) 524 can be changed, without changing the orientation of the probe card 502. The importance of this feature, a technique for performing alignment of the tips of the probes, and alternate mechanisms (means) for adjusting the planarity of the space transformer are discussed in greater detail hereinbelow, with respect to FIG. 7. Evidently, the interposer 504 ensures that electrical connections are maintained between the space transformer 506 and the probe card 502 throughout the space transformer's range of adjustment, by virtue of the resilient or compliant contact structures disposed on the two surfaces of the interposer.

The probe card assembly 500 is simply assembled by placing the interposer 504 within the opening 552 of the front mounting plate 534 so that the tips of the interconnection elements 514 contact the contact terminals 510 of the probe card 502, placing the space transformer 506 on top of the interposer 504 so that the tips of the interconnection elements 516 contact the contact pads 520 of the space transformer 506, optionally placing a spacer 544 atop the space transformer 506, placing the mounting ring 540 over the spacer 544, and inserting the screws 542 through the mounting ring 540 through the spacer 544 and into the holes 554 of the front mounting plate 534, and mounting this "subassembly" to the probe card 502 by inserting screws (one shown partially as 555) through the rear mounting plate 530 and through the probe card 502 into threaded holes (not shown) in the bottom (as viewed) surface of the front mounting plate 534. The actuator mounting plate 538 can then be assembled (e.g., with screws, on of which is shown partially as 556) to the rear mounting plate 530, pivot spheres 560 dropped into the holes 550 of the actuator mounting plate 532, and the differential screw elements 536 and 538 inserted into the holes 550 of the actuator mounting plate 532.

In this manner, a probe card assembly is provided having a plurality of resilient contact structures (524) extending therefrom for making contact with a plurality of bond pads (contact areas) on semiconductor dies, prior to their singulation from a semiconductor wafer, at a fine pitch which is commensurate with today's bond pad spacing. Generally, in use, the assembly 500 would be employed upside down from what is shown in the figure, with the semiconductor wafer being pushed (by external mechanisms, not shown) up onto the tips of the resilient contact structures (524).

As is evident from the figure, the front mounting plate (baseplate) 534 determined the position of the interposer 504 vis-a-vis the probe card 502. To ensure accurate positioning of the front mounting plate 534 vis-a-vis the probe card 502, a plurality of alignment features (omitted from the figure for illustrative clarity) such as pins extending from the front mounting plate) and holes extending into the probe card 502 may be provided.

It is within the scope of this invention that any suitable resilient contact structures (514, 516, 524) be employed on the interposer (504) and/or the space transformer (506), including tabs (ribbons) of phosphor bronze material or the like brazed or soldered to contact areas on the respective interposer or space transformer.

It is within the scope of this invention that the interposer (504) and the space transformer (506) can be pre-assembled with one another, such as with spring clips, described as element 486 of FIG. 29 of the aforementioned copending, commonly-owned PCT/US94/13373, extending from the interposer substrate.

It is within the scope of this invention that the interposer (504) be omitted, and in its stead, a plurality of resilient contact structures comparable to 514 be mounted directly to the contact pads (520) on the lower surface of the space transformer. However, achieving coplanarity between the probe card and the space transformer would be difficult. A principal function of the interposer is to provide compliance to ensure such coplanarity.

Figure 5A:
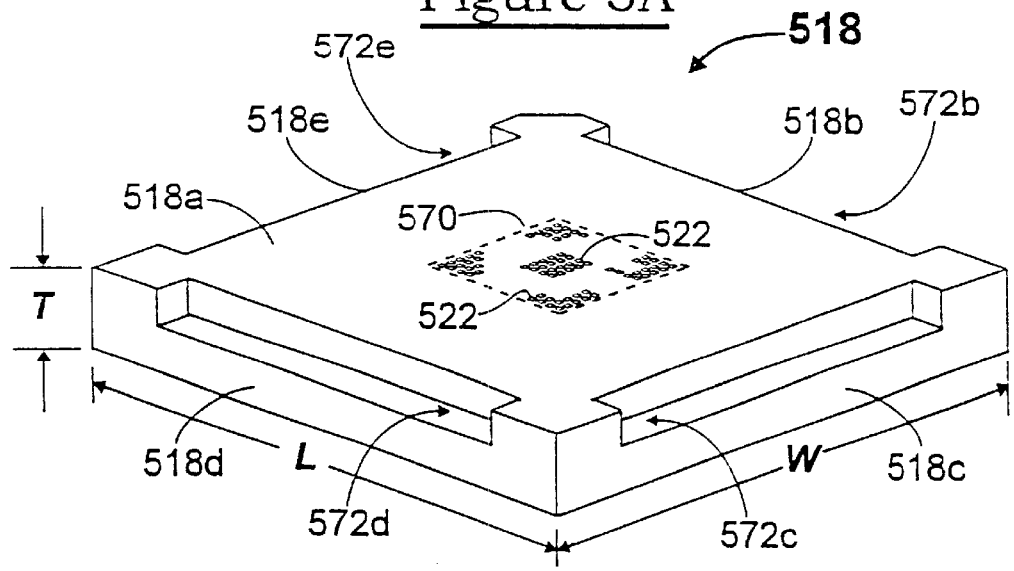
FIG. 5A is a perspective view of a space transformer component suited for use in the probe card assembly of FIG. 5, according to the invention.

FIG. 5A illustrates, in perspective view, a suitable space transformer substrate 518 for the probe card assembly 500 of FIG. 5. As shown therein, the space transformer substrate 518 is suitably a rectangular solid, having a length "L" a width "W" and a thickness "T". In this figure, the top surface 518a of the space transformer substrate 518 is visible, to which the probing interconnection elements (compare 524) are mounted. As shown, a plurality (such as several hundred) of contact pads 522 are disposed on the top surface 518a of the space transformer substrate 518 in a given area thereof. The given area is indicated by the dashed lines labelled 570 and, as is evident, the contact pads 522 may be arranged in any suitable pattern within the given area 570.

As mentioned hereinabove, the space transformer substrate 518 is suitably formed as a multi-layer ceramic substrate, having alternating layers of ceramic and patterned conductive material.

The fabrication of such multi-layer ceramic substrates is well known and is employed, for example, in the manufacture of Land Grid Array (LGA) semiconductor packages. By appropriately routing the patterned conductive material within such a multi-layer substrate, it is simple and straightforward to dispose contact pads (not visible in this view, compare 520) on the bottom surface (not visible in this view) of the substrate 518 at a pitch which is different than (e.g., larger than) the pitch of the contact pads 522 on the top surface 518a of the substrate 518, and to connect the contact pads 520 with the contact pads 522 to one another internally within the substrate 518. Achieving a pitch of approximately 10 mils between the contact pads 522 on such a substrate is very feasible.

FIG. 5A illustrates a preferred feature of the space transformer substrate 518. As mentioned, the substrate 518 is a rectangular solid having a top surface 518a, a bottom surface (hidden from view in this figure), and four side edges 518b, 518c, 518d and 518e. As is shown, notches 572b, 572c, 572d and 572e are provided along the intersections of the respective side edges 518b, 518c, 518d and 518e and the top surface 518a of the substrate 518 alone nearly the entire length (exclusive of the corners) of the respective side edges 518b . . . 518e. These notches 572b . . . 572e generally facilitate the manufacture of the space transformer substrate 518 as a multi-layer ceramic structure, and are also visible in the illustration of FIG. 5. It should be understood that the notches are not a necessity. Evidently, since the four corners of the substrate 518 are not notched (which is basically dictated by the process of making a ceramic, multilayer substrate), the mounting plate (540 of FIG. 5) must evidently accommodate these corner "features".

Figure 5B:
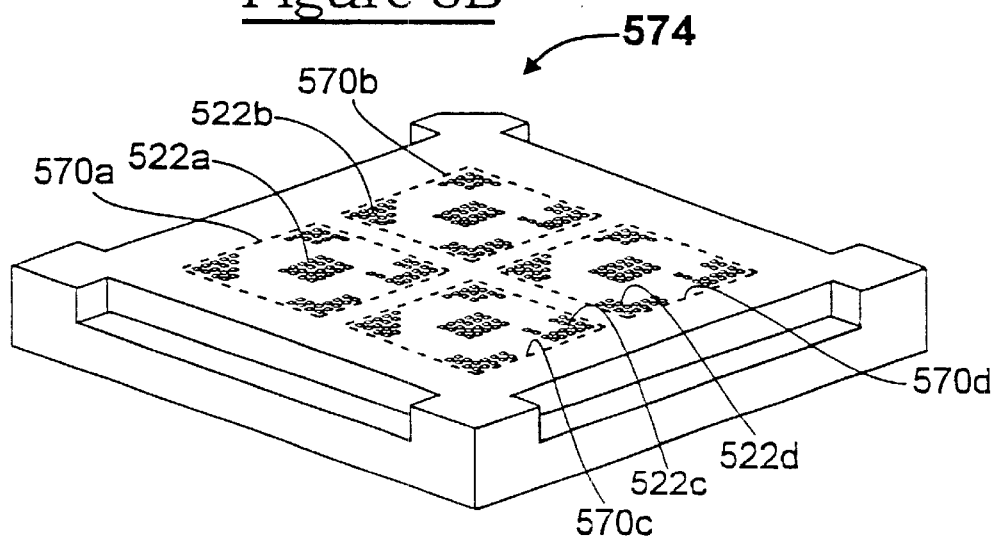
FIG. 5B is a perspective view of another space transformer component suited for use in the probe card assembly of FIG. 5, according to the invention.

FIG. 5B illustrates an embodiment of a space transformer substrate 574 which is comparable to the space transformer substrate 518 of the previous illustration, and which can similarly be employed in the probe card assembly 500 of FIG. 5. In this case, a plurality (four of many shown) of areas 570a, 570b, 570c and 570d are defined, within each of which a plurality of contact pads 522a, 522b, 522c can readily be disposed in any desired pattern. It is generally intended that the spacing of the areas 570a . . . 570d correspond to the spacing of die sites on a semiconductor wafer so that a plurality of die sites can simultaneously be probed with a single "pass" of the probe card. (This is especially useful for probing multiple memory chips resident on a semiconductor wafer.) Typically, the pattern of the contact pads 522a . . . 522d within the respective areas 570a . . . 570d of the substrate 574 will be identical to one another, although this is not absolutely necessary.

The illustration of FIG. 5B clearly demonstrates that a single space transformer can be provided with probe elements for probing (making pressure contacts with) a plurality (e.g., four, as illustrated) of adjacent die sites on a semiconductor wafer. This is beneficial in reducing the number of setdowns (steps) required to probe all of the die sites on a wafer. For example, if there are one hundred die sites on a wafer, and four sets of probe elements on the space transformer, the wafer need only be positioned against the space transformer twenty-five times (ignoring, for purposes of this example, that efficiency at the edge (periphery) of the wafer would be somewhat attenuated). It is within the scope of this invention that the arrangement of probe sites (e.g., 570a . . . 570d), as well as the orientation of the individual probe elements (e.g., staggered) can be optimized to minimize the number of touchdowns required to probe an entire wafer. It is also within the scope of this invention that the probe elements can be arranged on the surface of the space transformer in a manner that alternate probe elements make contact with different ones of two adjacent die sites on the wafer. Given that it is generally desirable that the probe elements all have the same overall length, it is evident that the unconstrained manner in which the probe elements can be attached (mounted) directly to any point on the two-dimensional surface of the space transformer is superior to any technique which constrains the location whereat the probe elements are attached to a probe card (e.g., ring arrangements, as described hereinabove). It is also within the scope of this invention that a plurality of non-adjacent die sites on a wafer could be probed in this manner. The present invention is particularly beneficial to probing unsingulated memory devices on a wafer, and is useful for probing die sites having any aspect ratio.

Figure 5C:
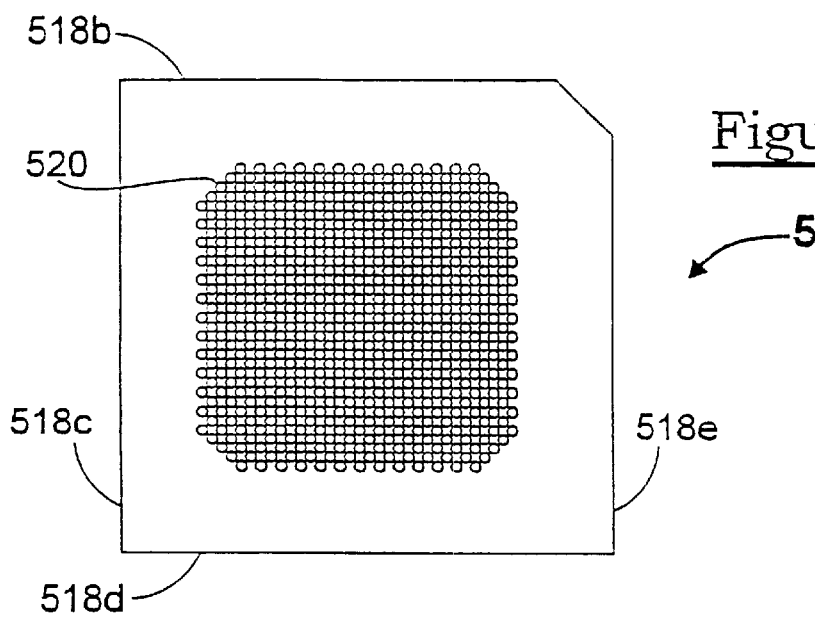
FIG. 5C is a bottom plan view of a space transformer component suited for use in the probe card assembly of FIG. 5, according to the invention.

FIG. 5C illustrates an exemplary layout of contact pads 520 on the bottom surface of the space transformer substrate 518, wherein the pads 520 are arranged in a pattern having a 100 mil pitch, each row of pads being staggered from the adjacent row of pads, and each pad having a diameter of approximately 55 mils.

Figure 6A:
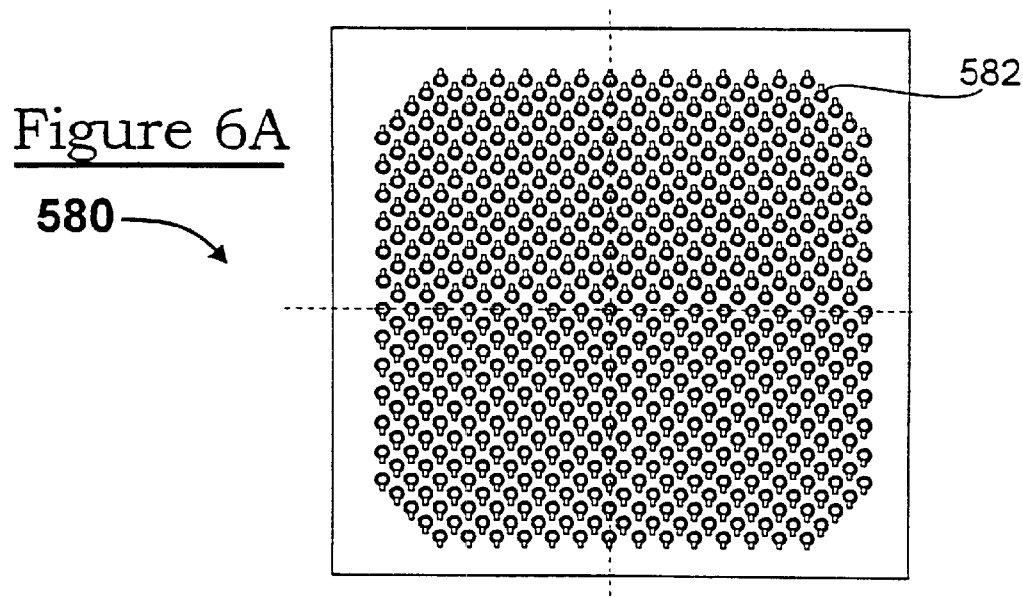
FIG. 6A is a bottom plan view of either the top or bottom surfaces of an exemplary interposer substrate for use in the probe card assembly of FIG. 5, according to the invention.
Figure 6B:
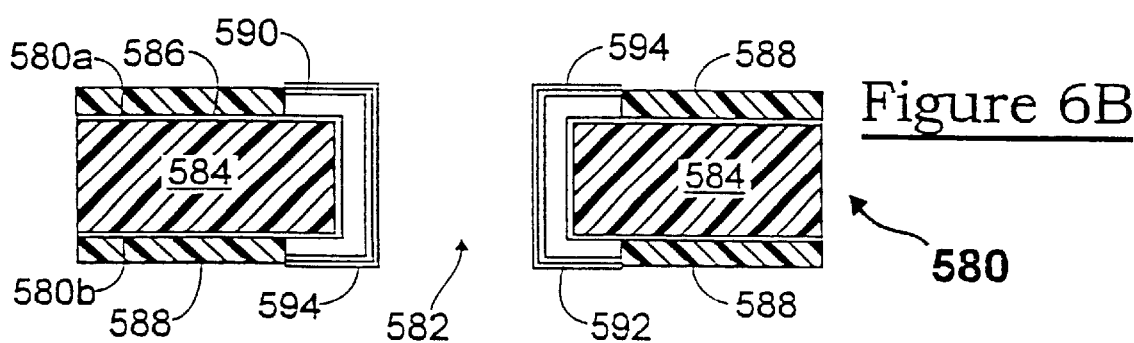
FIG. 6B is a partial cross-sectional view of the interposer component illustrated in FIG. 6A, according to the invention.

FIG. 6A is a plan view of either of the top or bottom surfaces of an exemplary interposer substrate 580 (compare 512), showing an exemplary layout of conductive areas (not illustrated in FIG. 5, compare FIG. 3A) to which the interconnection elements (514, 516) are mounted. FIG. 6B is a cross-sectional view of a portion of the same interposer substrate 580. As illustrated in FIG. 6B, a plurality of plated through holes 582 extend through the substrate 580, from a one surface 580a to an opposite surface 580b thereof. The substrate (board) itself is formed of conventional circuit board materials, using conventional techniques for fabricating plated through holes. In this example, the "base" board 584 is initially covered with an extremely thin (e.g., 100 microinch) "blanket" layer 586 layer of copper. A layer of photoresist 588 is applied to both surfaces of the board, and patterned to have openings permitting the plating up of the through holes 582. The through holes 582 are plated with an approximately 1 mil thick layer 590 of copper, over which is deposited a thin (e.g., at least 100 microinch) barrier layer 592 layer of nickel, over which is deposited a thin (e.g., at least 50 microinch) layer 594 of soft (pure) gold. The photoresist 588 is then removed, and vestiges of the initial extremely thin layer 586 of copper are removed from areas outside of the plated through hole 582. As illustrated in FIG. 6A, the plan view of each contact area formed by a plated through hole 582 is that of a circular ring, with a tab extending therefrom. The tab defines the orientation of the conductive area (pad) of the through hole exposed (for mounting interconnection elements) on the surface of the substrate 580. The pads are arrange at a 100 mil pitch, in staggered rows, with their orientations (as determined by their tabs) reversing at a centerline of the substrate surface.

With regard to the exemplary probe card assembly 500 described hereinabove, the following dimensions and materials are exemplary, for a given application:

a. the space transformer substrate 518 has a length (L) of 2.5 inches, a width (W) of 2.5 inches, and a thickness (T) of 0.25 inches, and has at least three alternating layers of ceramic and patterned conductor.

b. The interconnection elements 524 extending from the space transformer substrate 518 are the composite interconnection elements of the present invention, having a gold wire core with a diameter of 1.0 mils, overcoated by 1.5 mils of nickel, for an overall diameter of 4.0 mils. The overall height of the interconnection elements 524 is 40 mils.

c. The interposer substrate 512 is formed of conventional circuit board materials, has side dimensions of 1.850 inches and a thickness of 16 mils.

d. The interconnection elements 514 and 516 extending from the interposer substrate 512 are the composite interconnection elements of the present invention, having a gold wire core with a diameter of 1.0 mils, overcoated by 1.5 mils of nickel, for an overall diameter of 4.0 mils. The overall height of the interconnection elements 524 is 60 mils.

It is within the scope of the invention, and is generally preferred, that although the interconnection elements 514 and 516 are illustrated in FIG. 5 as single interconnection elements, each illustrated element is readily implemented as an interconnection structure having two or more interconnection elements in the manner described hereinabove with respect to FIG. 3A, to ensure that reliable pressure contacts are made to the respective contact terminals 510 of the probe card 502 and contact pads 520 of the space transformer 506.

It should clearly be understood that the space transformer (506, 518, 574) and interposer (504, 580) can be supplied to an end user as a "kit" (or "subassembly"), in which case the end user would supply the probe card and associated mounting hardware (e.g., 530, 532, 534, 536, 538, 540, 544).

Although the invention has been illustrated and described in detail in the drawings and foregoing description, the same is to be considered as illustrative and not restrictive in character—it being understood that only preferred embodiments have been shown and described, and that all chances and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the parent case.

Aligning the Probe Card Assembly

Figure 7:
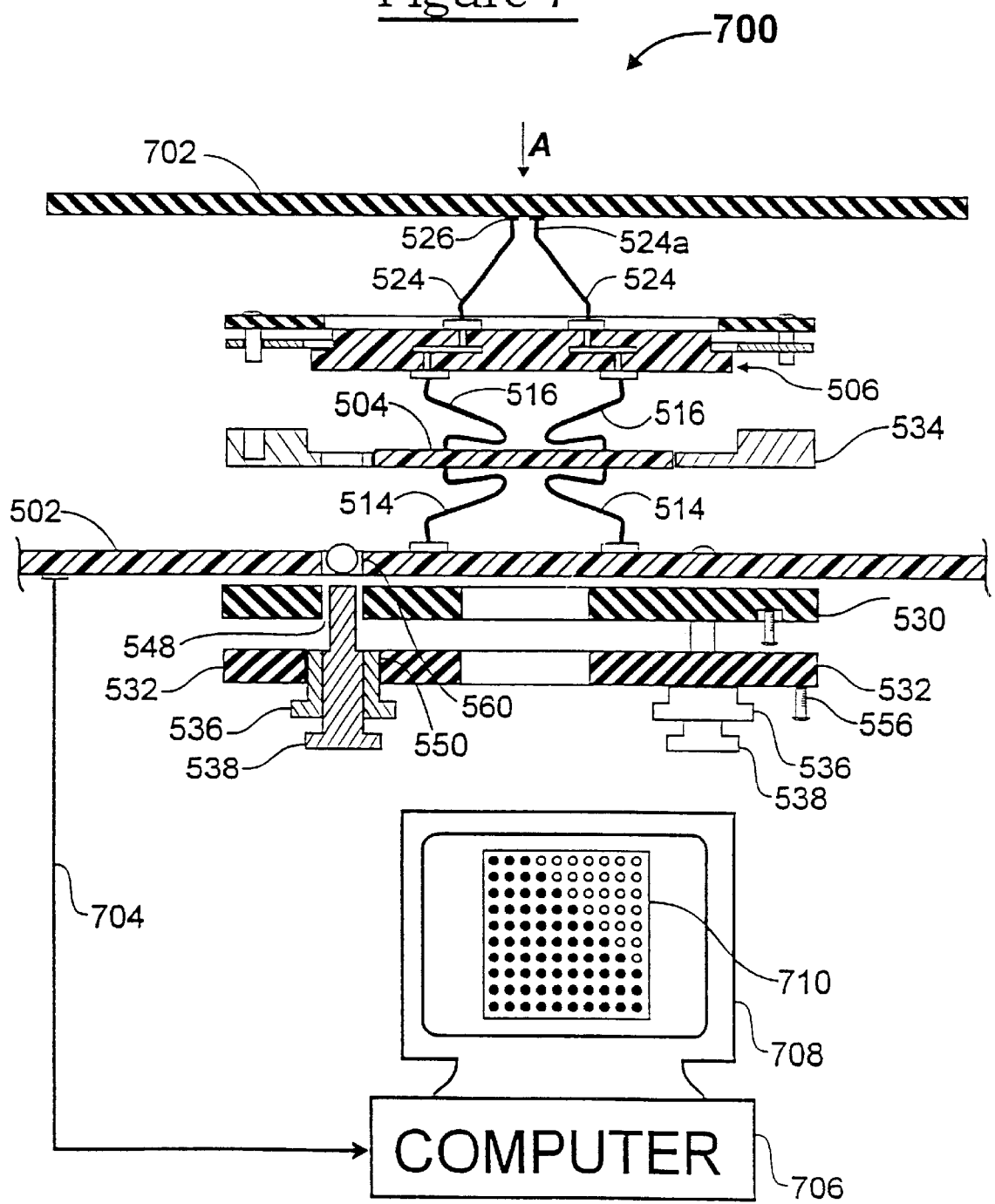
FIG. 7 is a view, partially in cross-section, and partially-schematic, of a probe card assembly similar to the probe card assembly illustrated in FIG. 5 being aligned or use in testing semiconductor wafers, according to the invention.

FIG. 7 illustrates a technique 700 of aligning a probe card assembly such as the probe card assembly 500 of FIG. 5. To this end, several of the elements of the probe card assembly 500 of FIG. 5 bear the same numbering (5xx) in this figure. The view of FIG. 7 is partially assembled, with the major components in contact with one another.

A problem addressed head on by this invention is that it is often difficult to align the contact tips of a probe card (or probe card insert) with respect to a semiconductor wafer being tested. It is essential that tolerances on the coplanarity of the tips of the probes and the surface of the wafer be held to a minimum, to ensure uniform reliable contact pressure at each the tip 524a (top ends, as viewed) of each probe (i.e, the resilient contact structures 524). As discussed hereinabove, a mechanism (e.g., differential screws 536 and 538) is provided in the probe card assembly for adjusting the planarity of the tips 524a of the probes by acting upon the space transformer 506. In this figure, the space transformer substrate 506 is illustrated with internal connection between the top terminals and the bottom terminals thereof, in the manner illustrated in FIG. 4, described hereinabove.

Prior to employing the probe card assembly to perform testing on a semiconductor wafer, the alignment of the probe tips is measured and, if necessary, adjusted to ensure that the probe tips 524a will be coplanar with semiconductor wafers that are subsequently presented to the probe card assembly (i.e., urged against the probe tips).

Generally, a wafer tester (not shown) in which the probe card assembly is mounted, will have a mechanism (not shown) for conveying semiconductor wafers into the region of the probe card assembly and urging the semiconductor wafers against the probe tips 524*a*. To this end, semiconductor wafers are held by a chuck mechanism (not shown). For purposes of this discussion, it is assumed that the tester and chuck mechanism are capable of moving wafer-after-wafer into a precise, repeatable location and orientation— the precise location of the wafer functioning as a "reference plane".

According to the invention, in order to align the tips 524*a* vis-a-vis the expected orientation of a semiconductor wafer, in other words vis-a-vis the reference plane, a flat electrically-conductive metal plate 702 is mounted in the tester in lieu of a semiconductor wafer. The flat metal plate 702 functions as an "ersatz" or "virtual" wafer, for purposes of aligning the tips 524*a* of the probes.

Each probe 524 is associated with a one of a plurality of terminals (not shown) on the probe card 502, a conductive path therebetween being constituted by a selected one of the probes 524, an associated selected one of the resilient contact structures 516 and an associated selected one of the resilient contact structures 514, and wiring layers (not shown) within the probe card 502. The probe card terminals may be in the form of surface terminals, terminals of a socket, or the like. A cable 704 connects between the probe card 502 and a computer (tester) 706 which has a display monitor 708. The present invention is not limited to using a computing device, nor to a display monitor.

In this example, it is assumed that one hundred pressure contacts are sought to be effected between one hundred probe tips 524*a* arranged in a 10×10 rectangular array and one hundred terminals (e.g., bond pads) of a semiconductor wafer. The present invention is not, however, limited to any particular number of probe tips or any particular layout of bond pads.

The flat metal plate 702 is carried by the chuck (not shown) and urged (advanced, as indicated by the arrow labelled "A") against the probe tips 524*a*. This is done in a relatively gradual manner, so that it can be ascertained whether the probe tips 524*a* all contact the flat metal plate in unison (not likely), or whether certain ones of the probe tips 524*a* are contacted by the flat metal plate 702 prior to remaining ones of the probe tips 524*a*. In the illustration, the seventy-one filled circles (dots) within the area 710 on the monitor 708 indicate that seventy-one of the probe tips 524*a* have been contacted by the flat metal plate 702 prior to the remaining twenty-nine of the probe tips 524*a* (illustrated as empty circles) having been contacted by the flat metal plate 702. Based on this visual representation, it is evident that the space transformer 506 (or, possibly, the metal plate 702) is tilted (canted) to the left (as viewed) downwards (out of the page, as viewed), and the orientation of the space transformer 506 can readily be adjusted by suitable adjustments of the differential screws 536 and 538.

The adjustments necessary to achieve the desired goal of planar, simultaneous contact of all of the tips 524*a* with the flat metal plate 702, without altering the orientation of the probe card 502, so that all of the probe tips 524*a* make substantially simultaneous contact with the flat metal plate 702 are readily calculated, either on-line or off-line. By making the calculated adjustments, the tips 524*a* of the probes 524 will subsequently make substantially simultaneous contact with bond pads on semiconductor wafers being tested.

The "go/no-go" (contact/no contact) type of testing discussed in the previous paragraph is illustrative of a first "order" of alignment that is facilitated by the probe card assembly of the present invention. A second "order" of alignment is readily performed by recording (e.g., in the computer memory) the sequence (order) in which the probe element tips contact the metal plate. The first tip to contact the metal plate generally will generally represent a corner of the space transformer that is too "high", and needs to be lowered (e.g., by adjusting the differential screws). Likewise, the last tip to contact the metal plate will generally represent a corner of the space transformer that is too "low", and needs to be heightened (e.g., by adjusting the differential screws). It is within the scope of this invention that any suitable algorithm can be employed to determine the adjustments required to be made, based on the sequence of tips contacting the metal plate. It is also within the scope of this invention that a resistance (e.g., to ground) between each probe tip 524*a* and the flat metal plate 702 can be measured and displayed as a numeral, or symbol, or dot color, or the like, indicative of the measured resistance, rather than merely as a filled circle versus an unfilled circle on the display monitor, although such is generally not preferred.

It is within the scope of this invention that any suitable mechanism can be employed for adjusting the orientation of the space transformer 506—in other words, planarizing the tips 524*a* of probes 524. Alternatives to using the differential screws (536, 538) arrangement discussed hereinabove would be to use servo mechanisms, piezoelectric drivers or actuators, magnetostrictive devices, combinations thereof (e.g., for gross and fine adjustments), or the like to accomplish such planarizing.

Figure 7A:
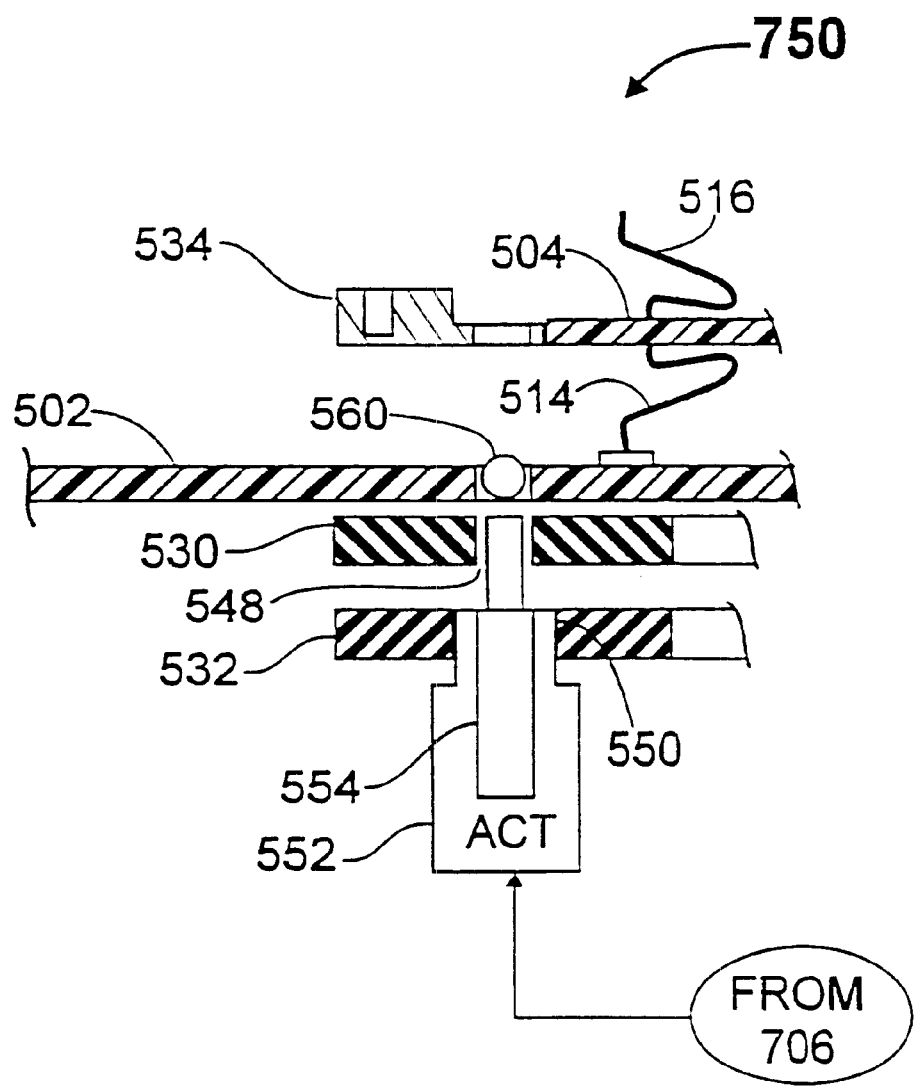
FIG. 7A is a view, partially in cross-section, and partially-schematic, or a technique for automatically adjusting the orientation of the space transformer component, according to the invention.

FIG. 7A illustrates an automated technique 750 for adjusting the spatial orientation of the space transformer (not shown in this view). In this example, an actuator mechanism 552 (labelled "ACT") is substituted for the differential screws (536, 538) and operates in response to signals from the computer 706. Three such mechanisms 552 can be substituted for the three pairs of differential screw elements in a straightforward manner. Similar elements in FIG. 7A are labelled with identical numbers as appear in FIG. 7, and several elements appearing in FIG. 7 are omitted from the view of FIG. 7A, for illustrative clarity.

It is also within the scope of this invention that the mechanism (particularly an automated mechanism as illustrated in FIG. 7A) for planarizing the space transformer (506) can be disposed other than as shown in the exemplary embodiments described herein. For example, a suitable mechanism could be located between the top (as viewed) surface of the probe card (502) and the front mounting plate (534), or incorporated into the front mounting plate (534). The key feature of using any of these mechanisms is the ability to alter the angle (orientation) of the space transformer (e.g., 506) without requiring the orientation of the probe card (502) to be altered.

Pre-fabricating Tip Structures for the Probe Elements, Processing Probe Elements, and Joining the Tip Structures to the Probe Elements FIGS. 2D–2F, discussed hereinabove, disclose a technique for fabricating tip structures (258) on a sacrificial substrate (254), and fabricating composite interconnection elements 264 on the tip structures (258) for subsequent mounting to terminals of an electronic component. Such a technique can certainly be employed with respect to mounting composite interconnection elements having fabricated tip structures on the top surface of the space transformer (518).

Figure 8A:
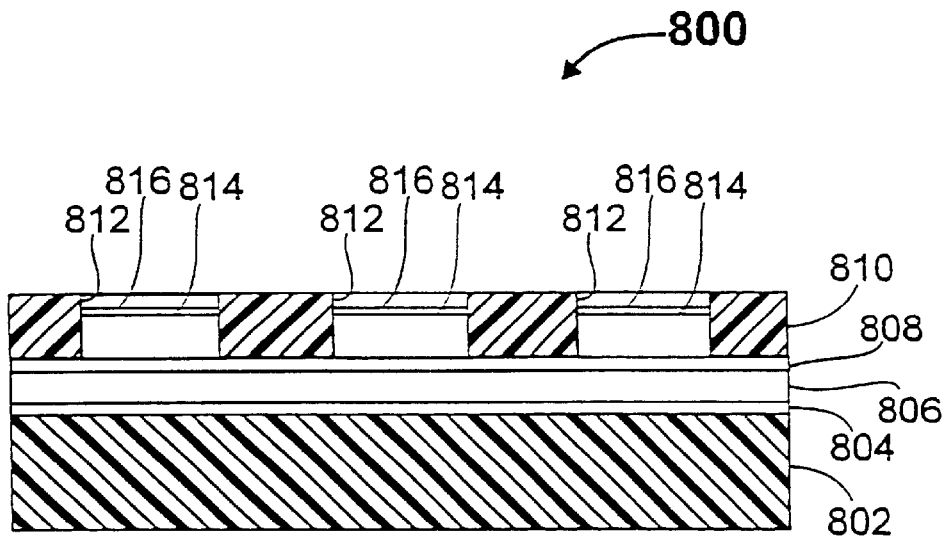
FIG. 8A is a cross-sectional view of a technique for fabricating tip structures for probe elements, according to the invention.

FIG. 8A illustrates an alternate technique 800 for fabricating composite interconnection elements having fabricated tip structures, particularly useful as the resilient contact structures residing atop the space transformer is now discussed. In this example, a silicon substrate (wafer) 802 having a top (as viewed) surface is used as the sacrificial substrate. A layer 804 of titanium is deposited (e.g., by sputtering) onto the top surface of the silicon substrate 802, and has a thickness of approximately 250 Å (1 Å=0.1 nm=$10^{-10}$ m). A layer 806 of aluminum is deposited (e.g., by sputtering) atop the titanium layer 804, and has a thickness of approximately 10,000 Å. The titanium layer 804 is optional and serves as an adhesion layer for the aluminum layer 806. A layer 808 of copper is deposited (e.g., by sputtering) atop the aluminum layer 806, and has a thickness of approximately 5,000 Å. A layer 810 of masking material (e.g., photoresist) is deposited atop the copper layer 808, and has a thickness of approximately 2 mils. The masking layer 810 is processed in any suitable manner to have a plurality (three of many shown) of holes 812 extending through the photoresist layer 810 to the underlying copper layer 808. For example, each hole 812 may be 6 mils in diameter, and the holes 812 may be arranged at a pitch (center-to-center) of 10 mils. The sacrificial substrate 802 has, in this manner, been prepared for fabricating a plurality of multilayer contact tips within the holes 812, as follows:

A layer 814 of nickel is deposited, such as by plating, onto the copper layer 808, and has a thickness of approximately 1.0–1.5 mils. Optionally, a thin layer (not shown) of a noble metal such as rhodium can be deposited onto the copper layer prior to depositing the nickel. Next, a layer 816 of gold is deposited, such as by plating, onto the nickel 814. The multilayer structure of nickel and aluminum (and, optionally, rhodium) will serve as a fabricated tip structure (820, as shown in FIG. 8B).

Figure 8B:
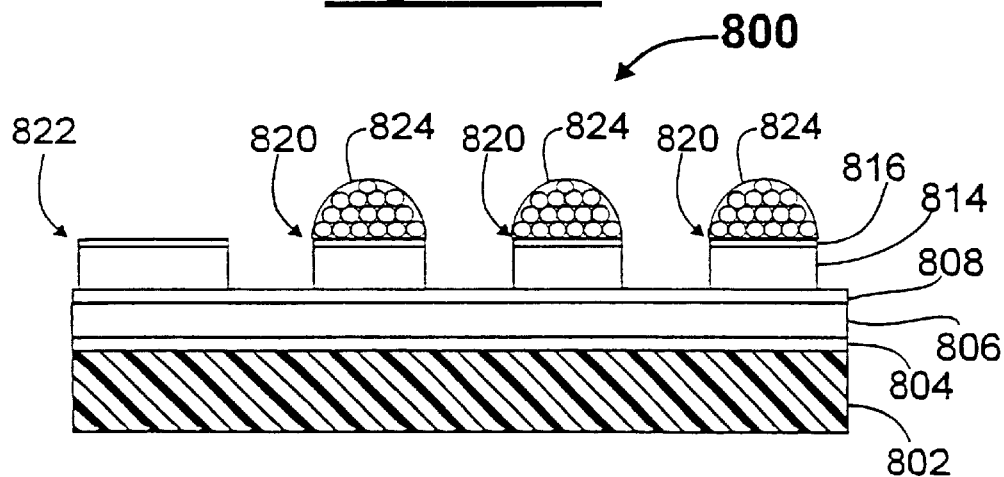
FIG. 8B is a cross-sectional view of further steps in the technique of FIG. 8A, according to the invention.

Next, as illustrated in FIG. 8B, the photoresist 810 is stripped away (using any suitable solvent), leaving a plurality of fabricated tip structures 820 sitting atop the copper layer 808. Next, the copper (808) is subjected to a quick etch process, thereby exposing the aluminum layer 806. As will be evident, aluminum is useful in subsequent steps since it is substantially non-wettable with respect to solder and braze materials.

It bears mention that it is preferred to pattern the photoresist with additional holes within which "ersatz" tip structures 822 may be fabricated in the same process steps employed to fabricate the tip structures 820. These ersatz tip structures 822 will serve to uniformize the aforementioned plating steps in a manner that is well known and understood, by reducing abrupt gradients (non-uniformities) from manifesting themselves across the surface being plated. Such structures (822) are known in the field of plating as "robbers".

Next, solder or brazing paste ("joining material") 824 is deposited onto the top (as viewed) surfaces of the tip structures 820. (There is no need to deposit the paste onto the tops of the ersatz tip structures 822). This is implemented in any suitable manner, such as with a stainless steel screen or stencil. A typical paste (joining material) 824 would contain gold-tin alloy (in a flux matrix) exhibiting, for example, 1 mil spheres (balls).

The tip structures 820 are now ready to be mounted (e.g., brazed) to ends (tips) of resilient contact structures, preferably the composite interconnect elements of the present invention. However, it is preferred that the composite interconnect elements first be specially "prepared" to receive the tip structures 820.

Figure 8C:
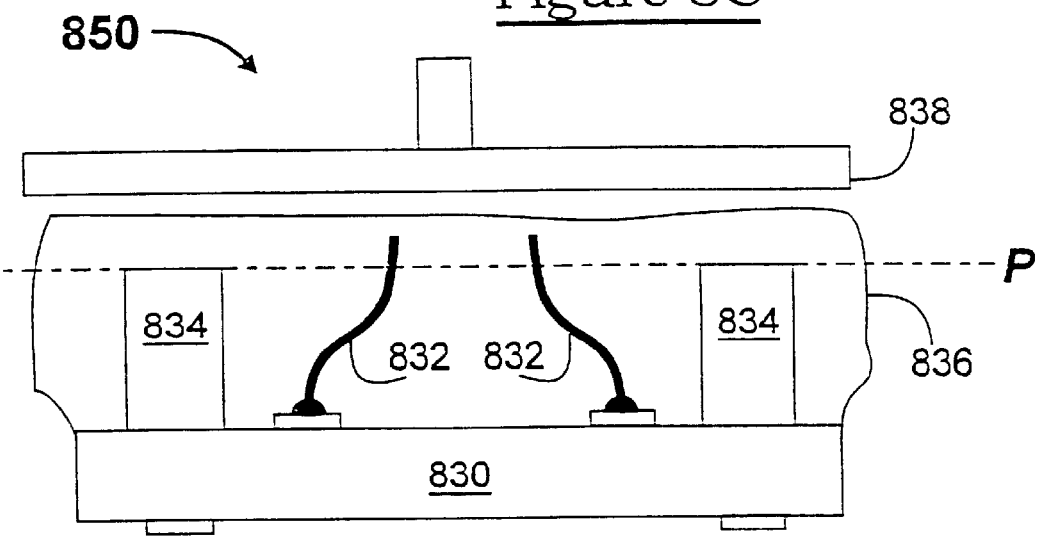
FIG. 8C is a side view, partially in cross-section and partially in full of a space transformer component, according to the invention.

FIG. 8C illustrates a technique 850 for preparing a space transformer substrate 830 (compare 506) with a plurality (two of many shown) of composite interconnection elements 832 (compare 524) in anticipation of tip structures (820) being mounted to the ends of the composite interconnection elements 832. The composite interconnections elements (probe elements) 832 are shown in full (rather than in cross section).

In this example, the composite interconnection elements 832 are multilayer (compare FIG. 2A) and have a gold (wire) core overcoated with a layer (not shown) of copper and further overcoated with a layer (not shown) of nickel (preferably a nickel-cobalt alloy having proportions 90:10 of Ni:Co), and further overcoated with a layer (not shown) of copper. As will be evident, it is preferred that the nickel layer be deposited to only a substantial portion (e.g., 80%) of its desired final thickness, the remaining small portion (e.g., 20%) of the nickel thickness being deposited in a subsequent step, described hereinbelow.

In this example, the space transformer substrate 830 is provided with a plurality (two of many shown) of pillar-like structures 834 extending from its top (as viewed) surface which, as will be evident, will function as polishing "stops". It is not necessary to have a large number of these polishing stops, and they are readily formed with and of the same material as the substrate (e.g., ceramic).

The space transformer substrate 830 is then "cast" with a suitable casting material 836, such as thermally-meltable, solution-soluble polymer, which serves to support the composite interconnection elements 832 extending from the top surface of the space transformer substrate. The top (as viewed) surface of the overmolded substrate is then subjected to polishing, such as with a polishing wheel 838 which is urged down (as viewed) onto the top surface of the casting material. The aforementioned polishing stops 834 determine the final position of the polishing wheel, as indicated by the dashed line labelled "P". In this manner, the tips (top ends, as viewed) of the composite interconnection elements 832 are polished to be substantially perfectly coplanar with one another.

As discussed hereinabove, a mechanism (e.g., differential screws or an automated mechanism) is provided in the overall probe card assembly (500) to orient the space transformer to ensure that the tips of resilient contact structures are coplanar with a semiconductor wafer being tested, and that the tips are planarized to make substantially simultaneous contact with the wafer. Certainly, starting with tips which have been planarized by polishing (or by any other suitable means) will contribute to achieving this important objective. Moreover, by ensuring that the ties of the probe elements (832) are coplanar to begin with, relaxes (reduces) the constraints imposed on the interposer component (534) to accommodate (by compliance) non-planarities in the tips of the probe elements (832) extending from the space transformer component.

After having planarized the tips of the probe elements by polishing, the casting material 836 is removed with a suitable solvent. (The polishing stops 834 will be removed at this time.) Casting materials are well known, as are their solvents. It is within the scope of this invention that casting materials such as wax, which can simply be melted away, can be used to support the probe elements (832) for polishing. The space transformer has, in this manner, been prepared to receive the aforementioned tip structures (820).

A beneficial side effect of the polishing operation is that the material overcoating the gold wire stem (core) of the composite interconnection element 832 will be removed at the tip, leaving the gold core exposed. Inasmuch as it is desired to braze tip structures (820) to the tips of the composite interconnection elements, having exposed gold material to braze to is desireable.

That having been said, it is preferred to further "prepare" the space transformer for receiving the tip structures by first performing one additional plating step—namely, nickel plating the composite interconnection elements 832 to provide the composite interconnection elements with the aforementioned remaining small portion (e.g., 20%) of their desired, overall nickel thickness.

Figure 8D:
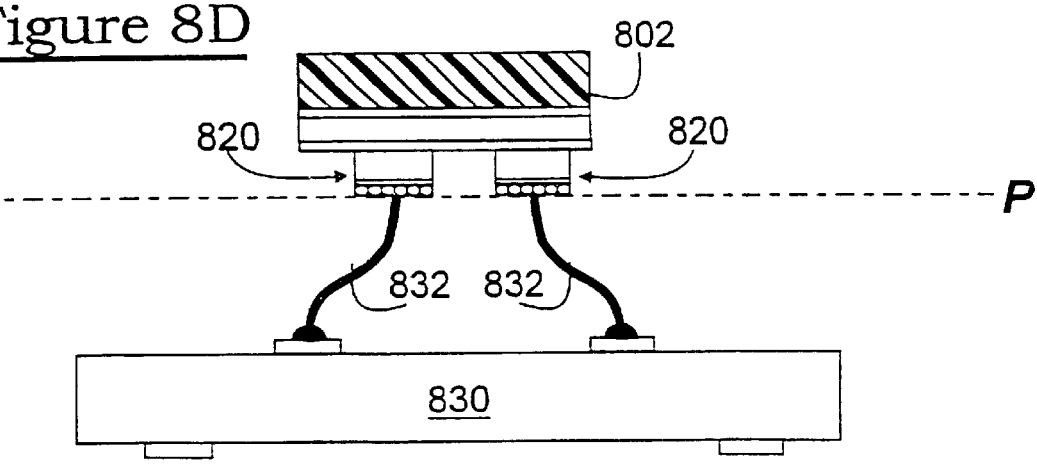
FIG. 8D is a side view, partially in cross-section and partially in full of the space transformer component of FIG. 8C being joined with the tip structures of FIG. 8B, according to the invention.

The prepared substrate shown in FIG. 8B is now brought to bear upon the prepared space transformer. As shown in FIG. 8D, the tip structures 820 (only two tip structures are shown in the view of FIG. 8D, for illustrative clarity) are aligned with the tips of the composite interconnection elements 832, using standard flip-chip techniques (e.g., split prism), and the assembly is passed through a brazing furnace to reflow the joining material 824, thereby joining (e.g., brazing) the prefabricated tip structures 820 to the ends of the contact structures 832.

It is within the scope of this invention that this technique can be used to join (e.g., braze) pre-fabricated tip structures to ends of non-resilient contact structures, resilient contact structures, composite interconnection elements, and the like.

Figure 8E:
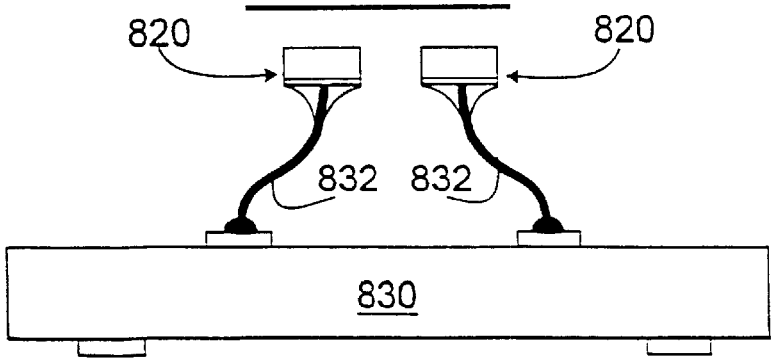
FIG. 8E is a side view, partially in cross-section and partially in full of a further step in joining the space transformer component of FIG. 8C joined with the tip structures of FIG. 8B, according to the invention.

During the reflow process, the exposed aluminum layer (806), being non-wettable, prevents solder (i.e., braze) from flowing between the tip structures 820, i.e., prevents solder bridges from forming between adjacent tip structures. In addition to this anti-wetting function of the aluminum layer, the aluminum layer also serves as a release layer. Using a suitable etchant, the aluminum is preferentially (to the other materials of the assembly) etched away, and the silicon substrate 802 simply "pops" off, resulting in a space transformer having composite interconnection elements (probe elements) each having a prefabricated tip structure, as illustrated in FIG. 8E. (Note that the joining material 824 has reflowed as "fillets" on end portions of the probe elements 832.) In a final step of the process, the residual copper (808) is etched away, leaving the tip structure 820 with nickel (or rhodium, as discussed hereinabove) exposed for making contact to terminals of an electronic component being probed.

It is within the scope of this invention, but it is generally not preferred, that composite interconnection elements (such as 832) can first be fabricated on the tip structures themselves, in the "spirit" of the technique described with respect to FIGS. 2D–2F, utilizing the tip structure metallurgy described with respect to FIG. 8A, and subsequently mounted to the space transformer substrate.

It is within the scope of the invention that the brazing (soldering) paste 824 is omitted, and in its stead, a layer of eutectic material (e.g., gold-tin) is plated onto the resilient contact structures prior to mounting the contact tips (820) thereto.

Although the invention has been illustrated and described in detail in the drawings and foregoing description, the same is to be considered as illustrative and not restrictive in character—it being understood that only preferred embodiments have been shown and described, and that all changes and modifications that come within the spirit of the invention are desired to be protected. Undoubtedly, many other "variations" on the "themes" set forth hereinabove will occur to one having ordinary skill in the art to which the present invention most nearly pertains, and such variations are intended to be within the scope of the invention, as disclosed herein. Several of these variations are set forth in the parent case.

For example, in any of the embodiments described or suggested herein where a masking material (e.g., photoresist) is applied to a substrate and patterned such as by exposure to light passing through a mask and chemically removing portions of the masking material (i.e., conventional photolithographic techniques), alternate techniques can be employed, including directing a suitable collimated light beam (e.g., from an excimer laser) at portions of the masking material (e.g., blanket hardened photoresist) sought to be removed, thereby ablating these portions of the masking material, or directly (without the use of a mask) hardening portions of the masking material with a suitable collimated light beam then chemically washing off the non-hardened masking material.

It has been suggested hereinabove that the composite interconnection elements of the present invention are but an example of suitable resilient contact structures that can be mounted directly to terminals of a space transformer component of a probe card assembly. For example, it is within the scope of this invention that needles of an inherently resilient (relatively high yield strength) material, such as tungsten, can be coated with a material, such as solder or gold, to make them solderable, optionally supported in a desired pattern, and soldered to the terminals of the space transformer.

What is claimed is:

1. A probe card assembly comprising:
   a probe card comprising a plurality of electrical contacts;
   a probe substrate having a plurality of elongate, resilient probe elements; and
   a second substrate disposed between and spaced from said probe card and said probe; and
   a plurality of elongate interconnection elements providing compliant electrical connections through said second substrate between said probe card and said probe substrate and thereby electrically connecting ones of said electrical contacts with ones of said probe elements.

2. The probe card assembly of claim 1, wherein said plurality of elongate interconnection elements extend from opposing surfaces of said second substrate.

3. The probe card assembly of claim 1, wherein each of said plurality of elongate interconnection elements is disposed such that each said elongate interconnection element passes through an opening in said second substrate, opposite ends of each said elongate interconnection element being spaced from said opposing surfaces of said interconnect structure.

4. The probe card assembly of claim 1, wherein said plurality of elongate interconnection elements exert forces against said probe card and said probe substrate.

5. The probe card assembly of claim 4, wherein said forces are spring forces.

6. The probe card assembly of claim 1, wherein said elongate interconnection elements are resilient.

7. The probe card assembly of claim 6, wherein at least one of said elongate interconnection elements comprises a core of a first material and a coating of a second material, wherein said second material is more resilient than said first material.

8. The probe card assembly of claim 1, further comprising means for altering an orientation of said probe substrate with respect to said probe card.

9. The probe card assembly of claim 1 further comprising at least one moveable element disposed so as to affect an orientation of said probe substrate with respect to said probe card.

10. The probe card assembly of claim 9, wherein said moveable element is threaded.

11. The probe card assembly of claim 9, wherein said moveable element comprises a screw.

12. The probe card assembly of claim 11, wherein said screw comprises a differential screw.

13. The probe card assembly of claim 1 further comprising at least one moveable element disposed so that movement of said element in a first direction causes at least a portion of said probe substrate to move toward said probe card.

14. The probe card assembly of claim 13, wherein movement of said moveable element in a second direction allows at least a portion of said probe substrate to move away from said probe card.

15. The probe card assembly of claim 1 further comprising a plurality of moveable elements, each disposed so as to affect a position of a portion of said probe substrate with respect to a portion of said probe card.

16. The probe card assembly of claim 1 further comprising a servo mechanism disposed to alter a position of said probe substrate with respect to said probe card.

17. The probe card assembly of claim 1 further comprising a piezoelectric actuator disposed to alter a position of said probe substrate with respect to said probe card.

18. The probe card assembly of claim 1, wherein said probe substrate comprises a space transformer.

19. The probe card assembly of claim 1, wherein said probe elements comprise a core of a first material and a coating of a second material, wherein said second material is more resilient than said first material.

20. A probe card assembly comprising:
   probe card means for providing electrical contacts to a tester;
   probe substrate means for providing elongate, resilient electrical contacts to a semiconductor device under test; and
   interconnection means for compliantly connecting electrically said probe card means and said probe substrate means at a plurality of variations in orientation of said probe substrate means with respect to said probe card means.

21. The probe card assembly of claim 20, wherein said interconnection means comprises a plurality of elongate interconnection elements for resiliently connecting electrically ones of said electrical contacts of said probe card means with ones of said electrical contacts of said probe substrate means.

22. The probe card assembly of claim 20 further comprising means for altering an orientation of said probe substrate means with respect to said probe card means.

23. A probe card assembly comprising:
   a probe card comprising a plurality of electrical contacts;
   a probe substrate moveably fixed to said probe card and comprising a plurality of elongate, resilient probe elements, ones of said elongate resilient probe elements being in electrical communication with ones of said electrical contacts; and
   a moveable element disposed so as to affect an orientation of said probe substrate with respect to said probe card.

24. The probe card assembly of claim 23, wherein movement of said moveable element in a first direction causes at least a portion of said probe substrate to move away from said probe card.

25. The probe card assembly of claim 24, wherein movement of said moveable element in a second direction allows at least a portion of said probe substrate to move toward said probe card.

26. The probe card assembly of claim 23, wherein said moveable element is threaded.

27. The probe card assembly of claim 23, wherein said moveable element comprises a screw.

28. The probe card assembly of claim 27, wherein said screw comprises a differential screw.

29. The probe card assembly of claim 23, wherein said moveable element comprises a servo mechanism.

30. The probe card assembly of claim 23, wherein said moveable element comprises a piezoelectric actuator.

31. The probe card assembly of claim 23 further comprising a plurality of said moveable elements.

32. The probe card assembly of claim 23, wherein said probe substrate comprises a space transformer.

33. The probe card assembly of claim 23, wherein said probe elements comprise a core of a first material and a coating of a second material, wherein said second material is more resilient than said first material.

34. A probe card assembly comprising:
   probe card means for providing an interface to a semiconductor tester;
   substrate means for supporting a plurality of elongate, resilient probe elements, said probe elements being in electrical communication with said probe card means, said probe substrate means being moveably fixed to said probe card means; and
   means for altering an orientation of said substrate means with respect to said probe card means.

35. The probe card assembly of claim 34, wherein said probe elements comprise a core of a first material and a coating of a second material, wherein said second material is more resilient than said first material.

36. The probe card assembly of claim 34 further comprising interposer means disposed between said probe card means and said substrate means for exerting forces against said probe card means and said substrate means.

* * * * *

(12) INTER PARTES REEXAMINATION CERTIFICATE (0349th)
United States Patent
Eldridge et al.

(10) Number: US 6,624,648 C1
(45) Certificate Issued: Feb. 28, 2012

(54) PROBE CARD ASSEMBLY

(75) Inventors: Benjamin N. Eldridge, Danville, CA (US); Gary W. Grube, Pleasanton, CA (US); Igor Y. Khandros, Orinda, CA (US); Gaetan L. Mathieu, Dublin, CA (US)

(73) Assignee: Formfactor, Inc., Livermore, CA (US)

Reexamination Request:
No. 95/000,375, Jun. 6, 2008

Reexamination Certificate for:
Patent No.: 6,624,648
Issued: Sep. 23, 2003
Appl. No.: 10/011,335
Filed: Dec. 5, 2001

Related U.S. Application Data

(63) Continuation of application No. 09/846,490, filed on Apr. 30, 2001, now Pat. No. 7,086,149, which is a division of application No. 09/156,957, filed on Sep. 18, 1998, now Pat. No. 6,246,247, which is a division of application No. 08/554,902, filed on Nov. 9, 1995, now Pat. No. 5,974,662, which is a continuation-in-part of application No. 08/533,584, filed on Oct. 18, 1995, now Pat. No. 5,772,451, and a continuation-in-part of application No. 08/526,246, filed on Sep. 21, 1995, now abandoned, and a continuation-in-part of application No. 08/452,255, filed on May 26, 1995, now Pat. No. 6,336,269, which is a continuation-in-part of application No. 08/340,144, filed on Nov. 15, 1994, now Pat. No. 5,917,707, which is a continuation-in-part of application No. 08/152,812, filed on Nov. 16, 1993, now Pat. No. 5,476,211, said application No. 08/340,144, is a continuation-in-part of application No. 08/152,812.

(51) Int. Cl.
*G01R 31/00* (2006.01)

(52) U.S. Cl. .................. 324/756.03; 257/E21.507; 257/E21.508; 257/E21.509; 257/E21.511; 257/E21.519; 257/E23.021; 257/E23.024; 257/E23.068; 257/E23.078; 257/E25.011; 257/E25.029; 257/E21.503; 257/E21.525

(58) Field of Classification Search .................. None
See application file for complete search history.

(56) References Cited

To view the complete listing of prior art documents cited during the proceeding for Reexamination Control Number 95/000,375, please refer to the USPTO's public Patent Application Information Retrieval (PAIR) system under the Display References tab.

*Primary Examiner* — Beverly M. Flanagan

(57) ABSTRACT

A probe card assembly includes a probe card, a space transformer, and an interposer disposed between the space transformer and the probe card. Suitable mechanisms for adjusting the orientation of the space transformer without changing the orientation of the probe card, and for determining what adjustments to make, are disclosed.

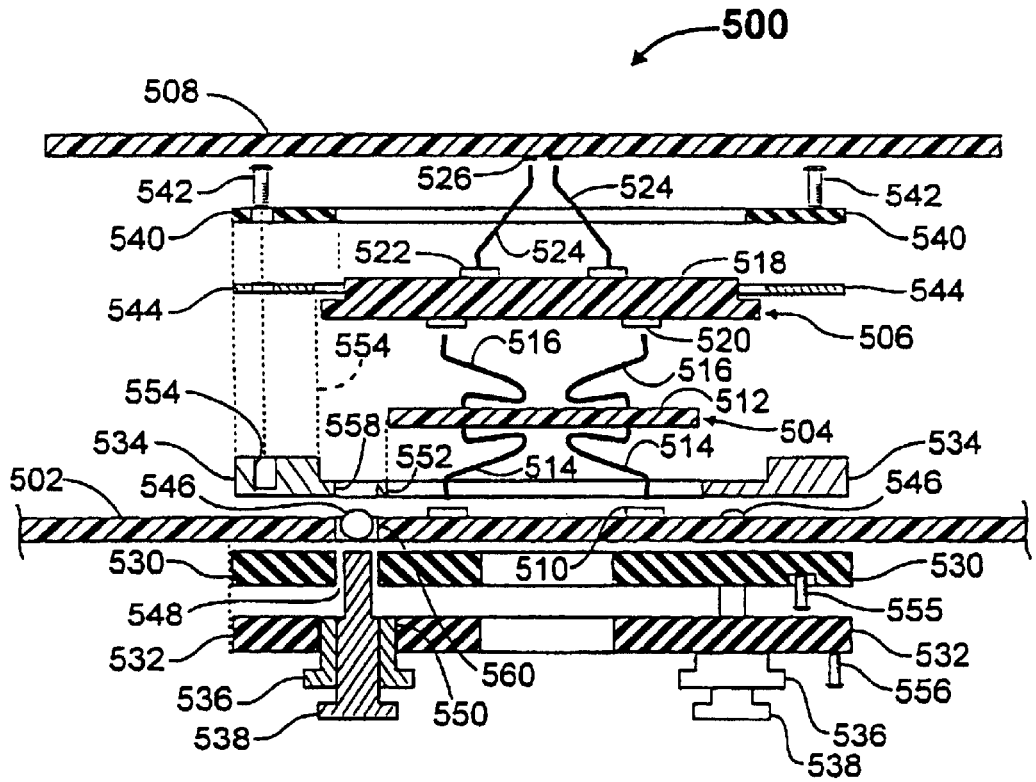

INTER PARTES REEXAMINATION CERTIFICATE ISSUED UNDER 35 U.S.C. 316

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 20-36 is confirmed.

Claims 1 is determined to be patentable as amended.

Claims 2-19, dependent on an amended claim, are determined to be patentable.

New claims 37-80 are added and determined to be patentable.

1. A probe card assembly comprising:
   a probe card comprising a plurality of electrical contacts;
   a probe substrate having a plurality of elongate, resilient probe elements; and
   a second substrate disposed between and spaced from said probe card and said probe *substrate*; and
   a plurality of elongate interconnection elements providing compliant electrical connections through said second substrate between said probe card and said probe substrate and thereby electrically connecting ones of said electrical contacts with ones of said probe elements.

37. *A probe card assembly comprising:*
    *a probe card comprising a plurality of electrical contacts;*
    *a probe substrate having a plurality of elongate, resilient probe elements; and*
    *a second substrate disposed between and spaced from said probe card and said probe substrate; and*
    *a plurality of composite elongate interconnection elements providing compliant electrical connections through said second substrate between said probe card and said probe substrate and thereby electrically connecting ones of said electrical contacts with ones of said probe elements,*
    *wherein each of said interconnection elements comprises a core structure and a metal coating on said core structure, wherein a yield strength of said metal coating is at least twice a yield strength of said core structure.*

38. *The probe card assembly of claim 37, wherein said plurality of elongate interconnection elements extend from opposing surfaces of said second substrate.*

39. *The probe card assembly of claim 37, wherein each of said plurality of elongate interconnection elements is disposed, such that each said elongate interconnection element passes through an opening in said second substrate, opposite ends of each said elongate interconnection element being spaced from said opposing surfaces of said interconnect structure.*

40. *The probe card assembly of claim 37, wherein said plurality of elongate interconnection elements exert forces against said probe card and said probe substrate.*

41. *The probe card assembly of claim 40, wherein said forces are spring forces.*

42. *The probe card assembly of claim 37, wherein said elongate interconnection elements are resilient.*

43. *The probe card assembly of claim 37, further comprising means for altering an orientation of said probe substrate with respect to said probe card.*

44. *The probe card assembly of claim 37 further comprising at least one moveable element disposed so as to affect an orientation of said probe substrate with respect to said probe card.*

45. *The probe card assembly of claim 44, wherein said moveable element is threaded.*

46. *The probe card assembly of claim 44, wherein said moveable element comprises a screw.*

47. *The probe card assembly of claim 46, wherein said screw comprises a differential screw.*

48. *The probe card assembly of claim 37, further comprising at least one moveable element disposed so that movement of said element in a first direction causes at least a portion of said probe substrate to move toward said probe card.*

49. *The probe card assembly of claim 48, wherein movement of said moveable element in a second direction allows at least a portion of said probe substrate to move away from said probe card.*

50. *The probe card assembly of claim 37 further comprising a plurality of moveable elements, each disposed so as to affect a position of a portion of said probe substrate with respect to a portion of said probe card.*

51. *The probe card assembly of claim 37, wherein said probe substrate comprises a space transformer.*

52. *A probe card assembly comprising:*
    *a probe card comprising electrical contacts to a tester;*
    *probe substrate means for providing elongate, resilient electrical contacts to a semiconductor device under test;*
    *interconnection means for flexibly connecting electrically said probe card and said probe substrate means over a range of different variations in orientation of said probe substrate means with respect to said probe card; and*
    *means for altering an orientation of said probe substrate means with respect to said probe card over said range of different variations in orientation of said probe substrate means with respect to said probe card.*

53. *The probe card assembly of claim 52, wherein said interconnection means comprises a plurality of elongate interconnection elements for resiliently connecting electrically ones of said electrical contacts of said probe card with ones of said electrical contacts of said probe substrate means.*

54. *The probe card assembly of claim 1, wherein:*
    *each of ones of said interconnection elements is elongate from said second substrate to said probe card, and*
    *each of others of said interconnection elements is elongate from said second substrate to said probe substrate.*

55. *The probe card assembly of claim 54, wherein each of said interconnection elements is independently freestanding.*

56. *The probe card assembly of claim 1, wherein said probe substrate comprises a multi-layer ceramic substrate comprising alternating layers of ceramic and patterned conductive material.*

57. *The probe card assembly of claim 23, wherein said moveable element is a moveable control element disposed to actively and selectively control said orientation of said probe substrate with respect to said probe card over a range* of different orientations of said probe substrate with respect to said probe card.

58. The probe card assembly of claim 57 further comprising:
   a second substrate disposed between and spaced from said probe card and said probe substrate; and
   interconnected pairs of resilient interconnection elements extending and elongate from opposite sides of said second substrate and providing flexible electrical connections between said probe card and said probe substrate and thereby electrically connecting said electrical contacts with said probe elements over said range of different orientations of said probe substrate with respect to said probe card.

59. The probe card assembly of claim 37, wherein:
   each of ones said interconnection elements is elongate from said second substrate to said probe card, and
   each of others of said interconnection elements is elongate from said second substrate to said probe substrate.

60. The probe card assembly of claim 59, wherein each of said interconnection elements is independently freestanding.

61. The probe card assembly of claim 37, wherein said probe substrate comprises a multi-layer ceramic substrate comprising alternating layers of ceramic and patterned conductive material.

62. A probe card assembly comprising:
   a probe card comprising electrical contacts connectable to a tester configured to control testing of an electronic device;
   a probe substrate comprising probe elements connectable to said electronic device; and
   a second substrate disposed between and spaced from said probe card and said probe substrate;
   interconnected pairs of resilient interconnection elements extending and elongate from opposite sides of said second substrate and providing flexible electrical connection between said probe card and said probe substrate and thereby electrically connecting said electrical contacts with said probe elements over a range of different orientations of said probe substrate with respect to said probe card; and
   adjustors configured to selectively alter an orientation of said probe substrate with respect to said probe card over said range of different orientations of said probe substrate with respect to said probe card.

63. The probe card assembly of claim 62, wherein each of said adjustors comprises a composite screw assembly.

64. The probe card assembly of claim 63, wherein said composite screw assembly comprises interconnected screw elements.

65. The probe card assembly of claim 64, wherein movement of one of said screw elements of said composite screw assembly with respect to another of said screw elements of said composite screw assembly changes a spacing between a portion of said probe substrate and said probe card.

66. The probe assembly of claim 64, wherein a threading of one of said screw elements of said composite screw assembly is different than a threading of another of said screw elements of said composite screw assembly.

67. The probe card assembly of claim 63, wherein said composite screw assembly comprises a differential screw.

68. The probe card assembly of claim 62, wherein advancing each of said adjustors toward said probe substrate pushes a portion of said probe substrate away from a portion of said probe card.

69. The probe card assembly of claim 68, wherein retracting each of said adjustors away said probe substrate allows said portion of said probe substrate to move toward said portion of said probe card.

70. The probe card assembly of claim 69, further comprising a spring biasing mechanism disposed to bias said probe substrate toward said probe card and against said adjustors.

71. The probe card assembly of claim 62, wherein each of said probe elements comprises an elongate, resilient body that extends away from said probe substrate.

72. The probe card assembly of claim 62, wherein said adjustors are configured to selectively alter and set said orientation of said probe substrate with respect to said probe card over said range of different orientations of said probe substrate with respect to said probe card.

73. The probe card assembly of claim 62, wherein each of said interconnection elements is independently freestanding.

74. The probe card assembly of claim 62, wherein said probe substrate comprises a multi-layer ceramic substrate comprising alternating layers of ceramic and patterned conductive material.

75. A probe card assembly comprising:
   a probe card comprising electrical contacts to a tester;
   probe substrate means for providing elongate, resilient electrical contacts to a semiconductor device under test; and
   interconnection means for compliantly connecting electrically said probe card and said probe substrate means at a plurality of variations in orientation of said probe substrate means with respect to said probe card.

76. The probe card assembly of claim 75, wherein said interconnection means comprises a plurality of elongate interconnection elements for resiliently connecting electrically ones of said electrical contacts of said probe card with ones of said electrical contacts of said probe substrate means.

77. The probe card assembly of claim 75 further comprising means for altering an orientation of said probe substrate means with respect to said probe card.

78. A probe card assembly comprising:
   a probe card comprising an interface to a semiconductor tester;
   substrate means for supporting a plurality of elongate, resilient probe elements, said probe elements being in electrical communication with said probe card, said probe substrate means being moveably fixed to said probe card; and
   means for altering an orientation of said substrate means with respect to said probe card.

79. The probe card assembly of claim 78, wherein said probe elements comprise a core of a first material and a coating of a second material, wherein said second material is more resilient than said first material.

80. The probe card assembly of claim 78 further comprising interposer means disposed between said probe card and said substrate means for exerting forces against said probe card and said substrate means.

* * * * *